(12) United States Patent
Yamazaki et al.

(10) Patent No.: US 8,970,106 B2
(45) Date of Patent: Mar. 3, 2015

(54) DISPLAY DEVICE AND METHOD FOR MANUFACTURING THE SAME

(75) Inventors: Shunpei Yamazaki, Tokyo (JP); Toru Takayama, Kanagawa (JP); Naoya Sakamoto, Tochigi (JP); Kengo Akimoto, Kanagawa (JP); Keiji Sato, Kanagawa (JP); Tetsunori Maruyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/360,838

(22) Filed: Jan. 30, 2012

(65) Prior Publication Data

US 2012/0129287 A1 May 24, 2012

Related U.S. Application Data

(62) Division of application No. 12/239,248, filed on Sep. 26, 2008, now Pat. No. 8,129,900, which is a division of application No. 10/937,904, filed on Sep. 10, 2004, now Pat. No. 7,492,090.

(30) Foreign Application Priority Data

Sep. 19, 2003 (JP) ................................. 2003-329201

(51) Int. Cl.
*H01J 1/62* (2006.01)
*H01J 63/04* (2006.01)
(Continued)

(52) U.S. Cl.
CPC ......... *H01L 51/5206* (2013.01); *H01L 27/3244* (2013.01); *H01L 27/3281* (2013.01); *H01L 27/3295* (2013.01)
USPC ........... 313/506; 313/483; 313/500; 313/501; 313/502; 313/503; 313/504; 313/505

(58) Field of Classification Search
None
See application file for complete search history.

(56) References Cited

U.S. PATENT DOCUMENTS

| 5,294,810 A | 3/1994 | Egusa et al. |
| 5,640,067 A | 6/1997 | Yamauchi et al. |

(Continued)

FOREIGN PATENT DOCUMENTS

| EP | 0883191 A2 | 12/1998 |
| EP | 0975029 A3 | 1/2000 |

(Continued)

OTHER PUBLICATIONS

C.W. Wang et al.; "Electrolunninescence of doped organic thin films"; Journal of Applied Physics vol. 65 No. 9; pp. 36103616; May 1, 1989.

*Primary Examiner* — Natalie Walford
(74) *Attorney, Agent, or Firm* — Fish & Richardson P.C.

(57) ABSTRACT

According to one aspect of the present invention, a laminated structure of conductive transparent oxide layers containing silicon or silicon oxide is applied as an electrode on the side of injecting a hole (a hole injection electrode; an anode) instead of the conventional conductive transparent oxide layer such as ITO. In addition, according to another aspect of the invention, a laminated structure of conductive transparent oxide layers containing silicon or silicon oxide, each of which content is different, is applied as a hole injection electrode. Preferably, silicon or a silicon oxide concentration of the conductive layer on the side where it is connected to a TFT ranges from 1 atomic % to 6 atomic % and a silicon or silicon oxide concentration on the side of a layer containing an organic compound ranges from 7 atomic % to 15 atomic %.

15 Claims, 12 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 6,111,274 | A | 8/2000 | Arai |
| 6,175,345 | B1 | 1/2001 | Kuribayashi et al. |
| 6,222,314 | B1 | 4/2001 | Arai et al. |
| 6,373,455 | B1 | 4/2002 | Kuribayashi et al. |
| 6,399,222 | B2 | 6/2002 | Arai et al. |
| 6,416,888 | B1 | 7/2002 | Kawamura et al. |
| 6,448,580 | B1 | 9/2002 | Arai et al. |
| 6,492,778 | B1 | 12/2002 | Segawa |
| 6,515,310 | B2 | 2/2003 | Yamazaki et al. |
| 6,541,918 | B1 | 4/2003 | Yudasaka |
| 6,608,449 | B2 | 8/2003 | Fukunaga |
| 6,614,174 | B1 | 9/2003 | Urabe et al. |
| 6,680,577 | B1 | 1/2004 | Inukai et al. |
| 6,734,671 | B2 | 5/2004 | Murata et al. |
| 6,836,070 | B2 | 12/2004 | Chung et al. |
| 6,852,997 | B2 | 2/2005 | Yamazaki et al. |
| 6,897,607 | B2 | 5/2005 | Sugimoto et al. |
| 6,909,409 | B2 | 6/2005 | Tanada |
| 6,911,163 | B2 | 6/2005 | Abe |
| 7,057,208 | B2 | 6/2006 | Akimoto et al. |
| 7,116,044 | B2 | 10/2006 | Fukunaga |
| 7,125,503 | B2 | 10/2006 | Abe |
| 7,183,580 | B2 | 2/2007 | Hayashi et al. |
| 7,667,393 | B2 | 2/2010 | Fukunaga |
| 8,012,529 | B2 | 9/2011 | Sakata et al. |
| 2002/0053871 | A1 | 5/2002 | Seo |
| 2002/0093285 | A1 | 7/2002 | Sugimoto et al. |
| 2002/0113241 | A1 | 8/2002 | Kubota et al. |
| 2002/0153831 | A1 | 10/2002 | Sakakura et al. |
| 2003/0117070 | A1 | 6/2003 | Komatsu et al. |
| 2003/0235935 | A1 | 12/2003 | Yamazaki et al. |
| 2004/0004434 | A1 | 1/2004 | Nishi et al. |
| 2004/0021415 | A1 | 2/2004 | Vong et al. |
| 2004/0027507 | A1 | 2/2004 | Iwakabe et al. |
| 2004/0029338 | A1 | 2/2004 | Yamazaki et al. |
| 2004/0048100 | A1 | 3/2004 | Ebisawa et al. |
| 2004/0066137 | A1 | 4/2004 | Hayashi |
| 2004/0135151 | A1 | 7/2004 | Okamoto et al. |
| 2005/0052127 | A1 | 3/2005 | Sakata et al. |
| 2005/0082966 | A1 | 4/2005 | Yamazaki et al. |
| 2005/0084994 | A1 | 4/2005 | Yamazaki et al. |
| 2005/0093432 | A1 | 5/2005 | Yamazaki et al. |
| 2005/0110020 | A1 | 5/2005 | Hayashi et al. |
| 2005/0224766 | A1 | 10/2005 | Abe |
| 2005/0224803 | A1 | 10/2005 | Yamazaki et al. |
| 2005/0242714 | A1 | 11/2005 | Chung et al. |
| 2005/0269943 | A1 | 12/2005 | Hack et al. |
| 2006/0061268 | A1 | 3/2006 | Nakanishi |
| 2007/0164671 | A1 | 7/2007 | Yamazaki et al. |
| 2007/0259466 | A1 | 11/2007 | Sakata et al. |

FOREIGN PATENT DOCUMENTS

| | | |
|---|---|---|
| EP | 2151865 A1 | 2/2010 |
| JP | 10-333601 A | 12/1998 |
| JP | 11-307261 A | 11/1999 |
| JP | 2000-012234 A | 1/2000 |
| JP | 2000-100575 A | 4/2000 |
| JP | 2000-108244 A | 4/2000 |
| JP | 2000-268954 A | 9/2000 |
| JP | 2000-276950 A | 10/2000 |
| JP | 2001-176673 A | 6/2001 |
| JP | 2001-0176674 A | 6/2001 |
| JP | 2002-033198 A | 1/2002 |
| JP | 3257913 A | 2/2002 |
| JP | 2002-208479 A | 7/2002 |
| JP | 2002-260447 A | 9/2002 |
| JP | 2004-087451 A | 3/2004 |

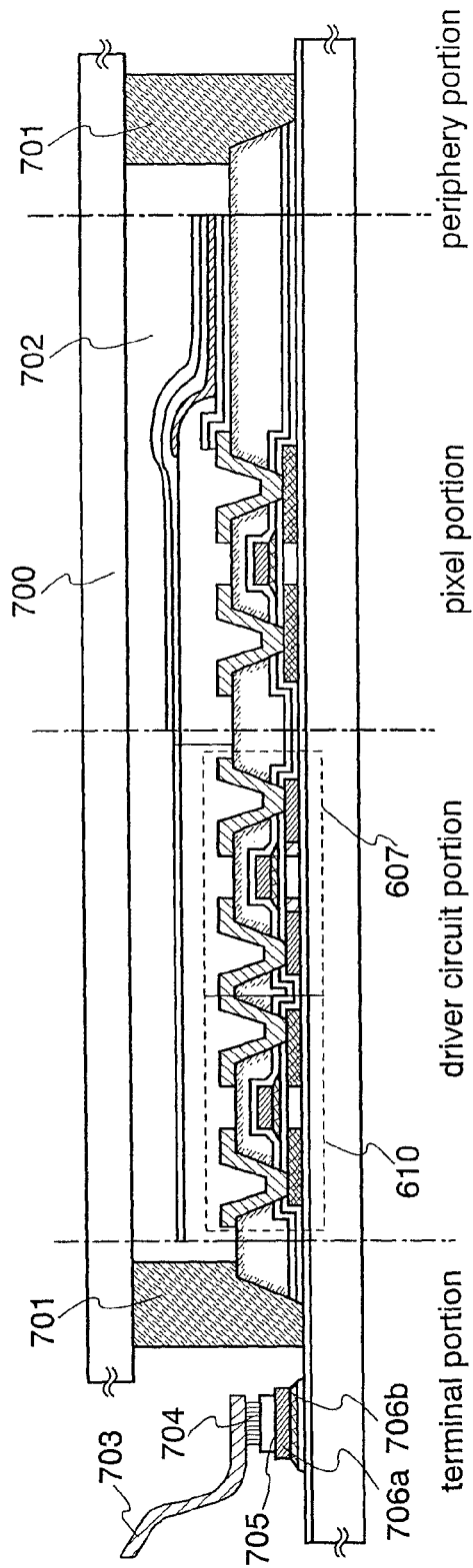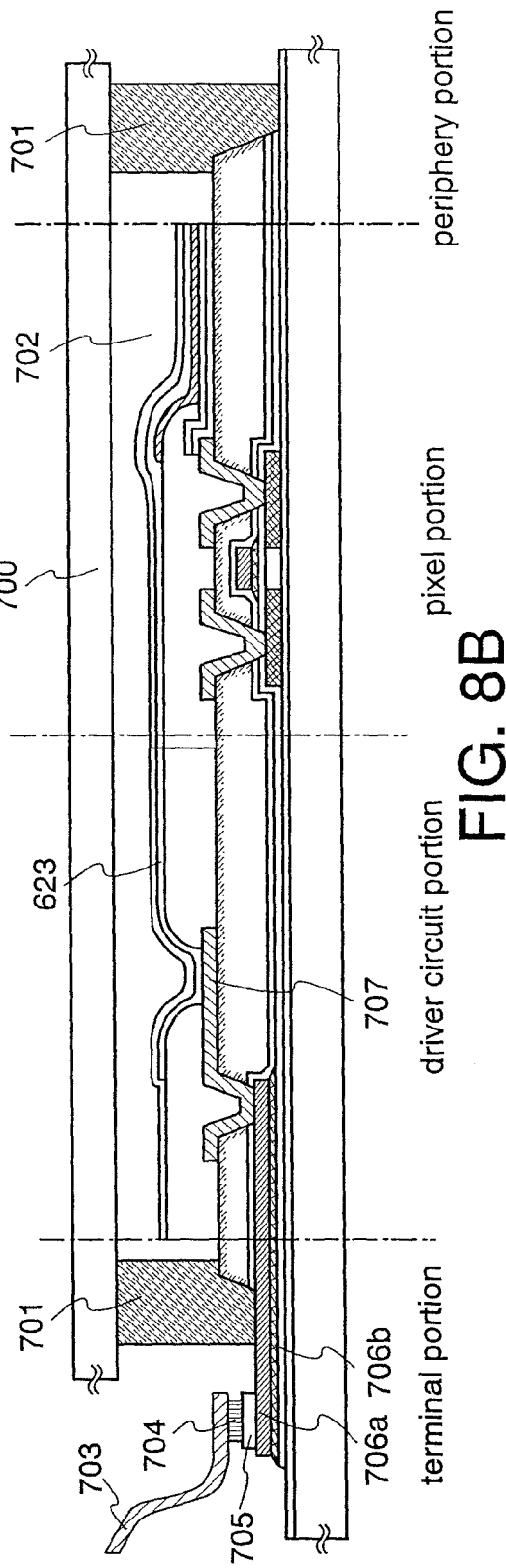
FIG. 8A
FIG. 8B pixel portion pixel portion pixel portion

DISPLAY DEVICE AND METHOD FOR MANUFACTURING THE SAME

CROSS-REFERENCE TO RELATED APPLICATIONS

This application is a divisional of U.S. application Ser. No. 12/239,248, filed Sep. 26, 2008, now allowed, which is a divisional of U.S. application Ser. No. 10/937,904, filed Sep. 10, 2004, now U.S. Pat. No. 7,492,090, which claims the benefit of a foreign priority application filed in Japan as Serial No. 2003-329201 on Sep. 19, 2003, all of which are incorporated by reference.

BACKGROUND OF THE INVENTION

1. Field of the Invention

The present invention relates to a display device utilizing a conductive transparent oxide layer as an electrode. Specifically, an object of the invention is to improve a light-emitting element in a luminescence property, to improve resistivity of an electrode, and to reduce power consumption of a display device by controlling a concentration of silicon or silicon oxide in the conductive layer.

2. Description of the Related Art

A light-emitting element formed by mainly sandwiching a material that emits electroluminescence (hereinafter referred to as "EL") made from an organic compound between a pair of electrodes is drawn attention. This light-emitting element is an element that utilizes a phenomenon of emitting light when recombining a hole injected from one electrode and an electron injected from the other electrode and returns to a ground state.

That is, this kind of light-emitting element is formed so that organic compounds having different carrier transport properties between a pair of electrodes are laminated, a hole can be injected from one electrode, and an electron can be injected from the other electrode. Injection of a hole and an electron into the organic compound is assumed one index by a size of a work function (a minimum energy that is necessary for extracting one electron to just the outside from a surface of metal or a semiconductor) of a material that forms an electrode. It is preferable that an electrode on the side of injecting a hole has a high work function, and an electrode on the side of injecting an electron has a low work function.

Conventionally, indium tin oxide (ITO) of which work function is approximately 5 eV is used for an electrode on the side of injecting a hole, which is called an anode, and is in contact with an organic compound having a high hole transport property. In addition, an alkali metal such as Li, Na, or, Mg, alkaline earth metal, Al, Ag, In, or an alloy containing them with a low work function is used for an electrode on the side of injecting an electron, which is called cathode, and is in contact with a material having a high electron transport property (Reference 1: Japanese Patent Application Laid-Open No. 2000-268954).

In addition to a hole injection layer such as copper phthalocyanine (CuPc) or molybdenum oxide ($MoO_x$), a hole transport layer such as 4,4'-bis-[N-(naphthyl)-N-phenyl-amino]biphenyl (α-NPD) which is an aromatic amine material, or an electron injection layer or an electron transport layer such as tris-8-quinolinolatoaluminum complex ($Alq_3$), a light-emitting layer added with a guest material such as quinacridon into a light-emitting material such as Alq3 or rubrene, or a host material such as 4,4'-bis(N-carbazolyl)-biphenyl (CBP) or 2,2',2"-(1,3,5-benzenetol-yl)-tris[1-phenyl-1H-benzimidazole] (TPB1) is known as an organic compound.

In order to improve a luminescence property of a light-emitting element, it is necessary to inject an electron and a hole efficiently from electrodes, to transport an injected electric charge efficiently to a light-emitting layer, to improve the recombining efficiency of the electron and the hole, and to improve luminous efficiency after recombining.

However, adequate luminance is not obtained in a conventional light-emitting element, that is, a light-emitting element having a structure in which an organic compound is sandwiched between an anode made from ITO or the like and a cathode made from MgAg, Al, and the like. In addition, power consumption is large and half-life time of luminescence is short in the conventional light-emitting element; therefore, there is a problem to be solved in respect of stability.

SUMMARY OF THE INVENTION

In view of the above problem, an object of the present invention is to provide a display device having favorable luminescence property, achieving brightness with lower power consumption, and having high stability.

According to one aspect of the invention, a laminated structure of conductive transparent oxide layers containing silicon (Si) or silicon oxide (SiOx), each of which content is different, is applied as an electrode (anode) on the side of injecting a hole (hereinafter, referred to as a "hole injection electrode").

An organic compound layer in the invention is referred to as a hole injection layer, a hole transport layer, a light-emitting layer, an electron transport layer, an electron injection layer, or the like in terms of a carrier transport property. The distinction between a hole injection layer and a hole transport layer is not necessarily strict, and these layers are the same in respect that a hole transport property (hole mobility) is especially an important property. For convenience, a layer on the side being in contact with an anode is referred to as a hole injection layer and a layer on the side being in contact with the hole injection layer is referred to as a hole transport layer to distinguish them. It is the same for the electron transport layer and the electron injection layer, and a layer being in contact with a cathode is referred to as an electron injection layer and a layer being in contact with the electron injection layer is referred to as an electron transport layer. When the light-emitting layer also serves as an electron transport layer, it is referred to as a light-emitting electron transport layer.

In addition, not only an organic compound but also even a complex material of an organic material and an inorganic material, a material added with a metal complex into an organic compound, and the like can be used for a light-emitting element applied to the invention, by substituting for it as long as it has the same property. For example, a film doped with MoOx into a film containing carbon as the main component can be used for a hole injection layer.

According to another aspect of the invention, a display device comprises a hole injection electrode formed by laminating a plurality, of conductive layers containing silicon or silicon oxide, and a layer containing an organic or inorganic compound formed being in contact with the hole injection electrode, wherein a silicon or silicon oxide concentration in a conductive layer adjacent to the layer containing an organic or inorganic compound is higher than a silicon or silicon oxide concentration of other conductive layer.

According to the other aspect of the invention, a display device comprises a hole injection electrode formed by laminating a plurality of conductive layers containing silicon or silicon oxide, and a layer containing an organic or inorganic compound formed being in contact with the hole injection electrode, wherein a silicon or silicon oxide concentration in a conductive layer adjacent to the layer containing an organic or inorganic compound ranges from 7 atomic % to 15 atomic %.

According to the other aspect of the invention, a display device comprises a hole injection electrode formed by laminating a plurality of conductive layers containing silicon or silicon oxide, and a layer containing an organic or inorganic compound formed being in contact with the hole injection electrode, wherein a conductive layer adjacent to the layer containing an organic or inorganic compound contains silicon or silicon oxide ranging from 7 atomic % to 15 atomic %, and at least one layer of other conductive layers contains silicon or silicon oxide ranging from 1 atomic % to 6 atomic %.

According to the other aspect of the invention, a display device comprises a hole injection electrode formed by laminating a plurality of conductive layers containing silicon or silicon oxide, a barrier layer containing silicon or silicon oxide as the main component formed on a surface of a conductive layer in a top layer or inside of a layer in vicinity of the surface among the conductive layers, and a layer containing an organic or inorganic compound formed on the barrier layer.

According to the other aspect of the invention, a method for manufacturing a display device comprises the steps of forming a hole injection electrode by laminating a plurality of conductive layers containing silicon or silicon oxide, using as a sputtering target a plurality of conductive materials containing silicon or silicon oxide different in content; and forming a layer containing an organic or inorganic compound to be in contact with the hole injection electrode.

According to the other aspect of the invention, a method for manufacturing a display device comprises the steps of forming a hole injection electrode by laminating a plurality of conductive layers containing silicon or silicon oxide, using a conductive material containing silicon or silicon oxide ranging at least from 1 atomic % to 6 atomic % and a conductive material containing silicon or silicon oxide ranging at least from 7 atomic % to 15 atomic %; and forming a layer containing an organic or inorganic compound to be in contact with the hole injection electrode.

According to the other aspect of the invention, a method for manufacturing a display device comprises the steps of forming a hole injection electrode by laminating a plurality of conductive layers with a conductive material containing silicon or silicon oxide; forming a barrier layer made of left silicon or left silicon oxide by selectively removing components of the conductive material from a surface of a conductive layer in a top layer or an inside of a layer in vicinity of the surface among the conductive layers; and forming a layer containing an organic or inorganic compound to be in contact with the barrier layer.

In the above-mentioned invention, the conductive transparent oxide layer is formed from a conductive transparent oxide material such as ITO, zinc oxide (ZnO), zinc oxide added with gallium (GZO), or IZO (Indium Zinc Oxide) mixed with zinc oxide (ZnO) ranging from 2 atomic % to 20 atomic % into indium oxide, using a target material including silicon, silicon oxide, or carbon with a sputtering method. At this time, in order to control a content of silicon oxide or the like contained in the conductive transparent oxide layer, a composition ratio in the target during sputtering may be changed.

Note that a conductive transparent oxide layer containing silicon (Si) or silicon oxide (SiOx) in ITO is hereinafter referred to as "ITSO" for convenience.

The following advantageous effect is obtained as a hole injection electrode by applying a laminated structure of the conductive transparent oxide layers containing silicon or silicon oxide and by containing silicon or silicon oxide of high concentration in a conductive layer on the side of an organic compound and containing silicon or silicon oxide of low concentration in the other conductive layer. That is, an original advantageous effect of work function of a hole injection electrode is obtained by providing a conductive layer containing silicon or silicon oxide of high concentration on the side of an organic compound layer; therefore, hole injection efficiency to a hole injection layer is increased and a luminescence property can be improved. In addition, resistivity of a hole injection electrode can be controlled low by providing a conductive layer containing silicon or silicon oxide of low concentration as the other conductive layer.

Here, a mechanism in which hole injection efficiency to a hole injection layer is improved by applying the conductive transparent oxide layer containing silicon or silicon oxide as a hole injection electrode as follows.

FIG. 3 shows a band scheme showing a contact of a conventional conductive transparent oxide (CTO) layer and a hole injection layer (HIL). When the contact is not formed properly, a band of a hole injection layer is warped in a direction that makes a barrier against an electron due to an effect of an interface potential, and a hole is stored in vicinity of the interface. The conductive transparent oxide film changes in a direction of which work function is low depending on a polluted state of the surface or the like. In such a case, injection of a hole decreases and a ratio that the injected hole contributes to light emission is decreased; therefore, current efficiency decreases.

On the other hand, in FIGS. 4A and 4B, a conductive transparent oxide layer of high silicon oxide concentration (CTO2) is provided adjacent to an HIL. Furthermore, the figures shows a band scheme in the case of a layer obtained by precipitating silicon (Si), silicon oxide (SiOx), silicon nitride (SiNx), silicon oxynitride (SiOxNy), silicon nitride oxide (SiNxOy), or the like in a step of forming a light-emitting element or a layer obtained by intentionally depositing silicon, silicon oxide, silicon nitride, and the like by a vapor deposition method or a sputtering method on the surface or inside a layer in vicinity of the surface (referred to as a "barrier layer"). In this case, a band is flattened as shown in FIG. 4A, or the band is bended below as shown in FIG. 4B so that the hole does not accumulate between the hole injection electrode and the HIL. Therefore, injection of a hole is improved and an advantageous effect of increasing a ratio that an injected hole contributes to light emission can be obtained.

According to the invention having the above-mentioned advantageous effect, a display device having high luminous efficiency, achieving brightness with lower power consumption, and having high stability can be provided in high yield.

BRIEF DESCRIPTION OF THE DRAWINGS

FIGS. 8A and 8B show schematic views of peripheral integrated active matrix display devices according to the invention;

DETAILED DESCRIPTION OF THE INVENTION

Hereinafter, embodiment mode of the present invention will be described below with reference to the accompanying drawings. However, it is to be understood that various changes and modifications can be made without departing from the scope of the present invention. For example, the invention can be carried out by appropriately combining embodiment mode and embodiments respectively. Therefore, the invention is not interpreted with limiting to the description in this embodiment mode.

Figure 1A:
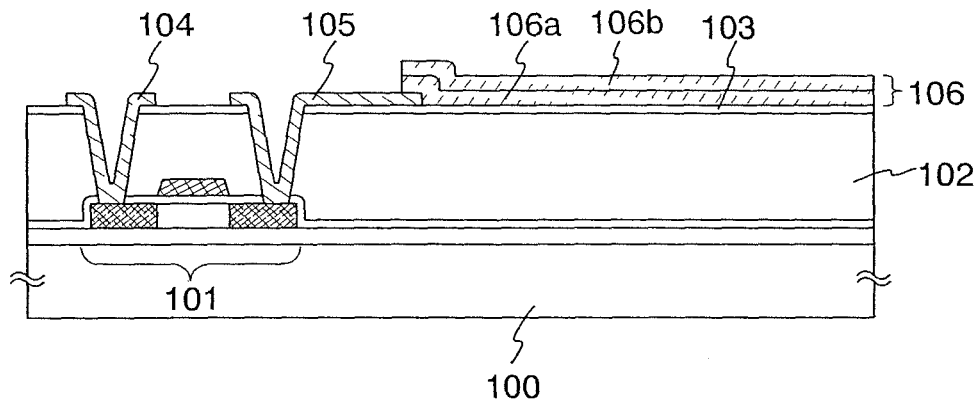
FIGS. 1A to 1C show schematic step view of a display device according to the present invention.
Figure 1B:
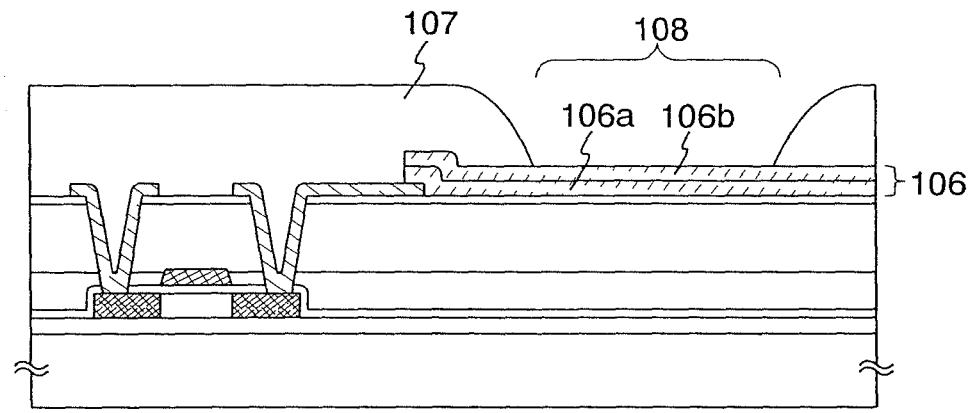
Figure 1C:
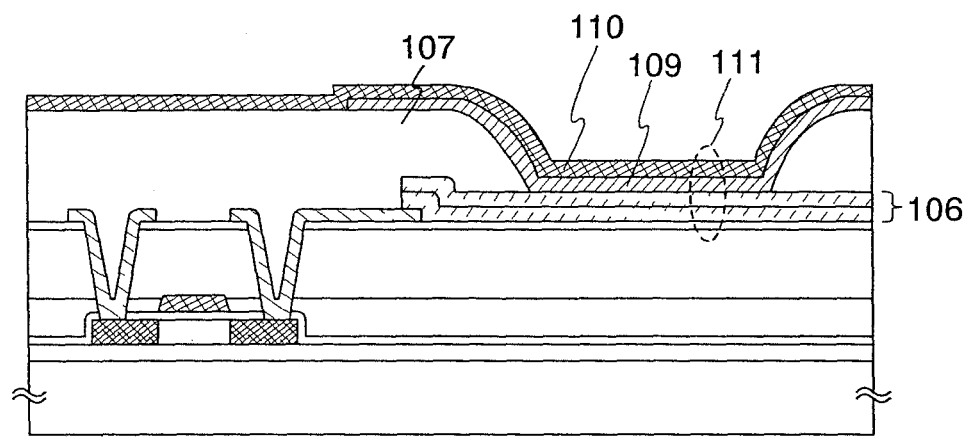
Figure 12:
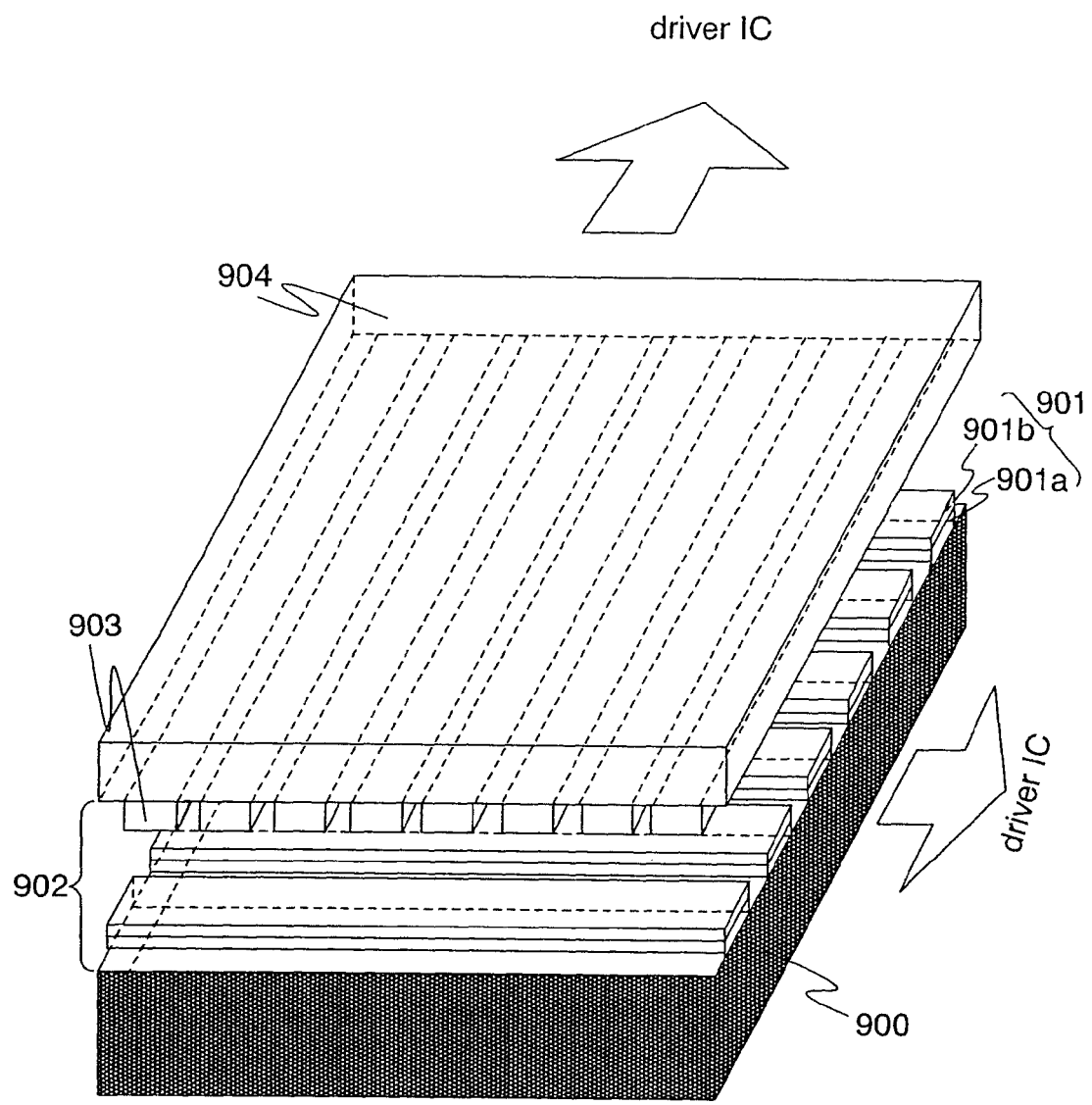
FIG. 12 shows a schematic view of a passive type display device according to the invention.

Over a substrate, a display device of the invention has an element structure in which a layer containing an organic compound that emits EL (an electroluminescent layer) is laminated between a hole injection electrode formed of a conductive transparent oxide layer or the like and an electrode of electron injection (a cathode) containing alkali metal or alkaline earth metal (hereinafter, referred to as an "electron injection electrode"). As shown in FIGS. 1A to 1C, the display device may be a so-called active matrix display device in which a laminated structure made of a hole injection electrode 106 (an anode), an organic compound layer 109, and an electron injection electrode 110 is provided over a transistor 101 after previously forming the transistor 101 like a TFT over the substrate 100. Alternatively, as shown in FIG. 12, the display device may be a so-called passive display device in which a conductive transparent oxide layer is formed by patterning directly on a substrate and an organic compound layer is sandwiched between the conductive transparent oxide layer and a cathode that is perpendicular to the conductive transparent oxide layer.

Here, a glass substrate, a quartz substrate, a silicon substrate, a metal substrate (Al or the like), a stainless substrate, a plastic substrate having heat resistance that withstands a processing temperature in a manufacturing process, or the like can be used for the substrate 100. Note that when a plastic substrate that is transformed by a processing temperature in a manufacturing process is used, a method for previously forming transistors on another substrate (a glass substrate, a quartz substrate, or the like) and transferring them to a plastic substrate thorough a peeled layer may be applied.

A layer containing an organic compound layer is a laminated layer of a hole transport layer, a light-emitting layer, and an electron transport layer in respect of a carrier transport property. In addition, a hole injection layer may be provided between a hole injection electrode and a hole transport layer, or an electron injection layer may be provided between an electron injection electrode and an electron transport layer. The distinctions between a hole injection layer and a hole transport layer and between an electron injection layer and an electron transport layer are not necessarily strict, and these layers are identical in respect that a hole transport property (hole mobility) and an electron transport property (electron mobility) are especially an important property. In addition, a structure in which a hole block layer is provided between an electron transport layer and a light-emitting layer may be also applied.

A light-emitting layer may have a structure with a different light-emitting color by adding a guest material such as pigment or a metal complex into a host material such as 4,4,'-bis (N-carbazolyl)-biphenyl (CBP), 2,2',2''-(1,3,5-benzenetolyl)-tris[1-phenyl-1H-benzimidazole] (TPBI). That is, a light-emitting layer may be formed by containing a fluorescent material or a phosphorescent material.

A conductive transparent oxide layer such as ITO, ZnO, IZO, GZO, and the like containing silicon or silicon oxide of 0% to 20 atomic % are laminated to be used for the hole injection electrode 106. In this case, at least two layers of the conductive transparent oxide layers have a different silicon or silicon oxide concentration each. The silicon or silicon or silicon oxide concentration in a conductive layer adjacent to the organic compound layer (referred to as a "second conductive layer 106*b*") is preferably higher than the silicon or silicon or silicon oxide concentration in the other conductive layer (referred to as a "first conductive layer 106*a*"). Furthermore, it is preferable that the silicon or silicon or silicon oxide concentration in the conductive layer 106*b* adjacent to the organic compound layer ranges from 7 atomic % to 15 atomic %. Accordingly, carriers of the hole injection electrode 106 and the organic compound layer 109 can easily move and hole injection efficiency to the organic compound layer 109 is improved, which can increase luminous efficiency.

In addition, a laminated structure including the first conductive layer 106*a* containing silicon or silicon oxide ranging from 1 atomic % to 6 atomic % and the second conductive layer 106*b* containing silicon or silicon oxide ranging from 7 atomic % to 15 atomic % is applied to the hole injection electrode 106. Accordingly, low resistance of the hole injection electrode can be realized by the first conductive layer 106*a*, and hole injection efficiency to the organic compound layer 109 can be improved by the second conductive layer 106*b*.

The hole injection electrode made of a conductive transparent oxide layer can be formed by a sputtering method using a target containing the conductive transparent oxide material and silicon oxide. In the target, a content ratio of silicon or silicon oxide to the conductive transparent oxide layer may be set to range from 1 atomic % to 20 atomic %; however, resistance of the hole injection electrode increases when a ratio of silicon oxide is increased; therefore, the hole injection electrode may be formed appropriately with this range. Of course, it may be formed by co-evaporation with a vacuum vapor deposition method as long as the same composition can be obtained.

Copper phthalocyanine (CuPc), molybdenum oxide ($MoO_x$), and the like may be used for the hole injection layer. As for the hole transport layer, in addition to 4,4'-bis-[N-(naphthyl)-N-phenyl-amino]biphenyl (α-NPD) which is an aromatic amine material, 4,4',4"-tris(N-3-methylphenyl-N-phenyl-amino)triphenylamine (MTDATA), and the like, poly (ethylenedioxythiophene)/poly (styrenesulfonic acid) solutions (PEDOT/PSS) and the like may be used as a high molecular weight based organic compound. These may be formed by a vacuum vapor deposition method, a spin application method, and the like.

In addition, before forming the hole injection layer, heat treatment may be carried out on the hole injection electrode at temperatures from 100° C. to 300° C., and wiping and cleaning treatment or polishing treatment may be carried out to improve planarity.

A light-emitting element 111 having the above-mentioned structure applies a laminated structure of the conductive transparent oxide layers containing silicon or silicon oxide having a different content as the hole injection electrode 106. Accordingly, an advantageous effect of original work function of the hole injection electrode is obtained and a carrier is efficiently utilized; therefore, hole injection efficiency to a hole injection layer can be increased and a luminescence property can be improved.

Next, a method for manufacturing a light-emitting element of the invention is described with reference to FIGS. 1A to 1C.

First, FIG. 1A shows the transistor 101 formed over the substrate 100. The transistor 101 corresponds to a driving transistor for supplying current to a light-emitting element formed later. The transistor 101 is covered with a first interlayer insulating film 102 and a second interlayer insulating film 103. In addition, source and drain regions of the transistor 101 are connected to wirings 104 and 105 formed to be in contact with the second interlayer insulating film 103 through contact holes formed in the first interlayer insulating film 102 and the second interlayer insulating film 103.

In addition, an organic insulating film, an inorganic insulating film or an insulating film containing a Si—O bond and a Si—CH$_x$ bonding hand formed by using a siloxane-based material as a start material can be used for the first interlayer insulating film 102. A film harder to transmit a substance that causes to promote deterioration of a light-emitting element such as water and oxygen than other insulating film is used for the second interlayer insulating film 103. Typically, a silicon nitride film formed by a RF sputtering method is used; however, besides, a diamond like carbon (DLC) film, an aluminum nitride film, and the like can be used.

A known material of Al, Ti, and TiN or a laminated structure thereof can be applied to the wirings 104 and 105. However, in order to ensure adhesion with the second interlayer insulating film (an oxynitriding silicon film) formed by sputtering method, it is preferable to apply a laminated structure including a layer mixing N in Ti (hereinafter, referred to as a "Ti (N)"). For example, a structure of laminating Ti (N), TiN, Al—Si, and TiN or a structure of laminating Ti (N), Al—Si, and Ti (N) is applied.

Next, the first conductive layer 106a and the second conductive layer 106b are laminated by a sputtering method over the second interlayer insulating film 103 and the wirings 104 and 105 by using targets containing ITO that contains silicon or silicon oxide of 20 atomic % or less or that does not contain silicon or silicon oxide. Thereafter, the hole injection electrode 106 is formed after a photo-exposing process using a photoresist mask. At this time, it is preferable that the first conductive layer 106a on the side of the second interlayer insulating film 103 contains silicon or silicon oxide ranging from 1 atomic % to 6 atomic % and the second conductive layer 106b on the side of the organic compound layer contains silicon or silicon oxide ranging from 7 atomic % to 15 atomic %.

A transparent conductive film containing silicon or silicon oxide in IZO, GZO, and the like may be used for the hole injection electrode 106, in addition to the above ITSO. In addition, a conductive transparent oxide layer containing carbon in a conductive film such as the above ITO or ITSO may be also used.

After peeling the photoresist mask, the hole injection electrode 106 may be cleaned or polished with a CMP method and a polyvinyl alcohol-based porous material so that the surface of the hole injection electrode 106 is flattened. In addition, after polishing using a CMP method, hydro cleaning (washing) may be carried out, and further, ultraviolet ray irradiation, oxygen plasma treatment, and the like may be carried out on the surface of the hole injection electrode 106.

Here, a barrier layer containing Si, SiOx, SiNx, and the like as the main component can be formed on the surface of the hole injection electrode 106 containing an ITSO layer or in the layer in vicinity thereof by carrying out a step of peeling a photo resist mask, a step of washing hydro, a step of ultraviolet ray irradiation, and the like. Hereinafter, a process of obtaining this barrier layer is described.

Table 1 shows a result obtained by carrying out surface composition analysis of the ITSO and ITO by using X-ray photoelectron spectroscopy analyzer (ESCA). It is understood that ITSO contains silicon of 4% to 5% in its composition ratio.

TABLE 1

| | | O | Si | In | Sn |
|---|---|---|---|---|---|
| ITSO | within 1 nm from the surface | 57 | 5 | 32 | 6 |
| | within 4 nm to 5 nm from the surface | 61 | 4 | 30 | 5 |
| ITO | within 4 nm to 5 nm from the surface | 62 | — | 36 | 2 |

[atomic %]

Figure 5A:
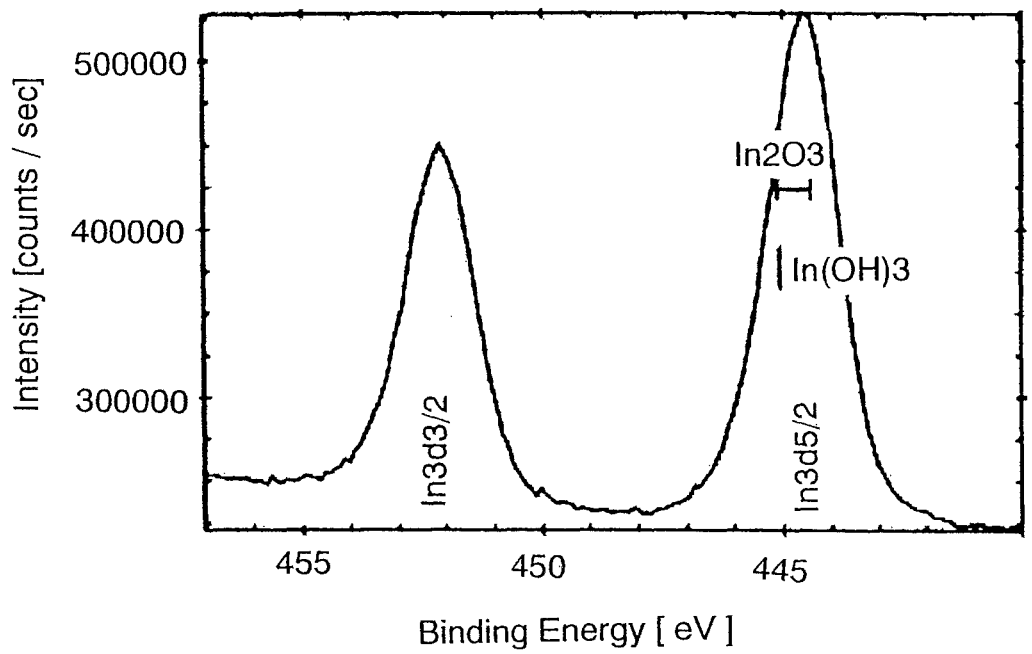
FIGS. 5A and 5B show peaks (surface: 1 nm or less) of ESCA analysis in ITSO.
Figure 5B:
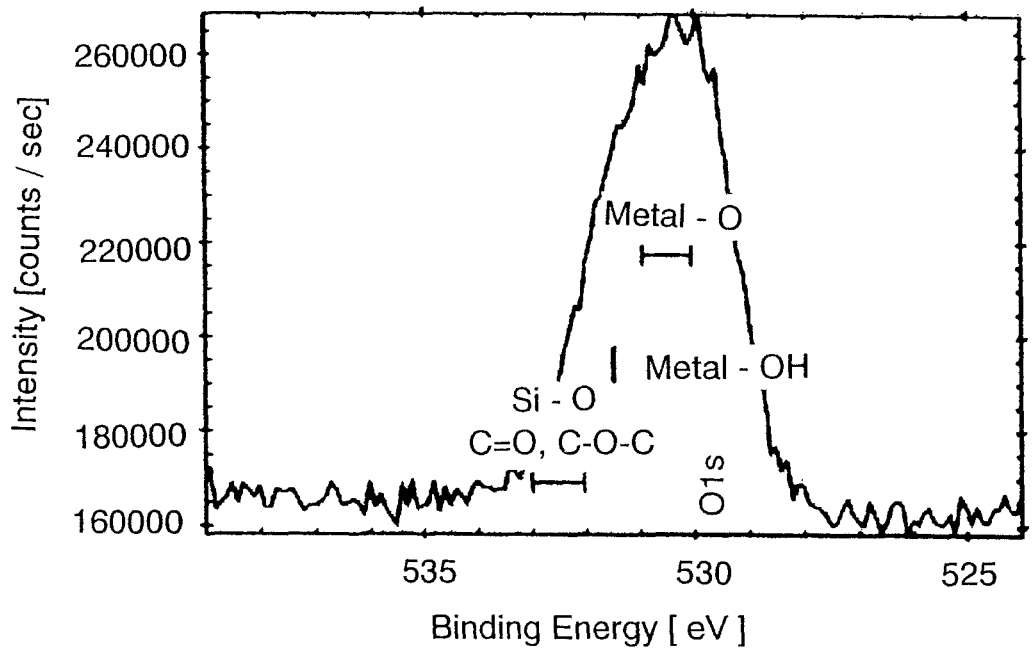
Figure 6A:
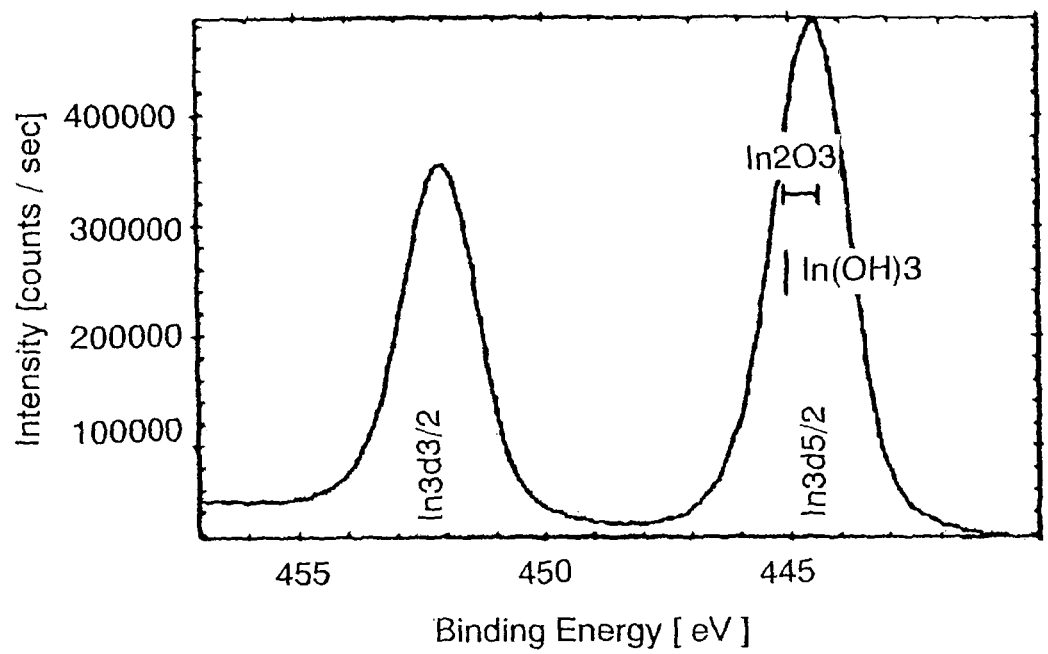
FIGS. 6A and 6B show peaks (surface: 4 nm to 5 nm) of ESCA analysis in ITSO.
Figure 6B:
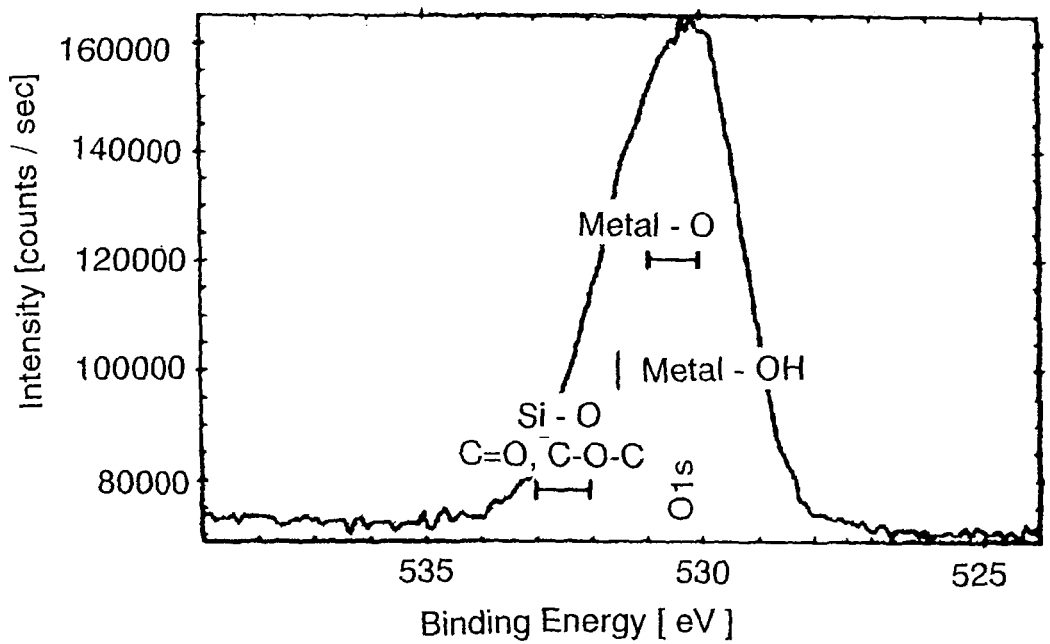

In addition, FIGS. 5A, 5B, 6A and 6B show ESCA spectra data of the ITSO within 1 nm from the surface (FIGS. 5A and 5B) and within 4 nm to 5 nm from the surface in depth (FIGS. 6A and 6B). FIGS. 5A and 6A show In3d3/2 and In3d5/2 peaks and FIGS. 5A and 6A show an O1s peak. According to these figures, it is understood that at least the ITSO within 1 nm to 5 nm from the surface in depth is not affected by a surface contaminant absorbed material in the surface (carbon, oxygen, and the like) and that a constant binding state is maintained. Therefore, when the ITSO containing a constant content of silicon oxide is formed, a constant content of Si is contained in the ITSO within 1 nm to 5 nm from the surface in depth. On the other hand, the surface of the ITSO film is exposed to a peeling solution, cleaning water, ultraviolet radiation, or the like in a step of peeling a photo resist mask, a step of hydro washing, a step of ultraviolet ray irradiation, or the like. Therefore, indium (In), tin (Sn) contained in the surface of the ITSO, an oxide thereof (InOx and SnOx), and the like can be removed. As a result, silicon (Si), silicon oxide (SiOx), silicon nitride (SiNx), silicon oxynitride (SiOxNy) or silicon nitride oxide (SiNxOy), and the like can be precipitated on the surface of the hole injection electrode 106 containing the ITSO layer or inside the layer in vicinity of the surface. Therefore, a layer containing at least one of them as the main component (a barrier layer) can be formed in a self-aligned manner.

Figure 4A:
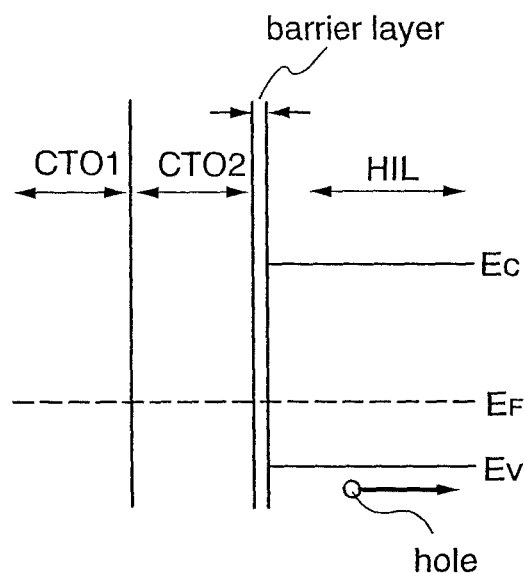
FIGS. 4A and 4B shows views of band schemes showing a contact condition of a conductive layer and a hole injection layer when a conductive layer is laminated.
Figure 4B:
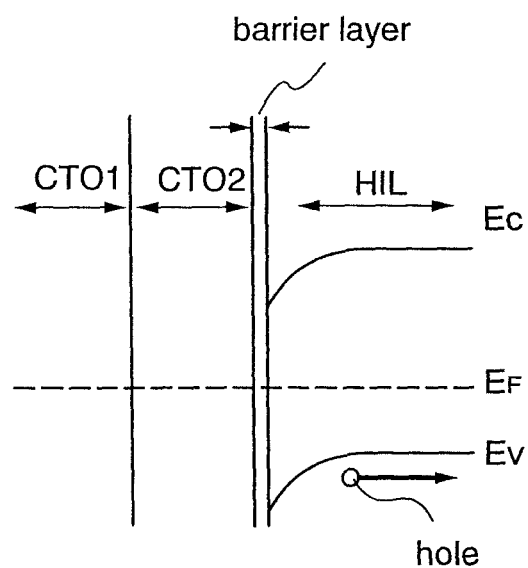

In addition, such a barrier layer can be also formed by intentionally depositing silicon, silicon oxide, silicon nitride, or the like by a vapor deposition method or a sputtering method. By the existence of the barrier layer, the work function of the hole injection electrode increases and the hole injection property is improved (FIGS. 4A and 4B).

Next, as shown in FIG. 1B, an insulator 107 (also referred to as a bank, a side wall, a barrier, an embankment, and the like) covering the wirings 104 and 105, the second interlayer insulating film 103, and a part of the hole injection electrode 106 is formed. An organic resin film, an inorganic insulating film or an insulating film containing a Si—O bond and a Si—CH$_x$ bonding hand formed by using a siloxane-based material as a start material can be used for the insulator 107.

For example, when a positive-type (that is, solubilizes an irradiated portion with light) photosensitive acrylic resin is used for the insulator 107, a portion to be an opening 108 is irradiated with light by stepper to form a pattern of the insulator 107. Thereafter, after the acrylic resin is baked with an oven (for example, under a condition of at 200° C. for 60 minutes), O$_2$ ashing is carried out to form the opening 108.

Note that an edge in the opening 108 of the insulator 107 is preferable to be formed in round so that no hole is formed in a layer containing an organic compound formed later on the edge (hereinafter, just referred to as the "organic compound layer 109"). Specifically, a curvature radius of a curve shown by a cross section of the insulator 107 in the opening is drawn preferably ranges approximately from 0.2 µm to 2 µm. According to the above structure, a step coverage of the organic compound layer 109 formed over the insulator 107 can be favorable and the electron injection electrode 110 formed over the hole injection electrode 106 and the organic compound layer 109 can be prevent from being short-circuited. In addition, by relieving a stress of the organic compound layer 109, defect called a shrink that a light emitting area decreases is reduced, and thus, reliability can be improved.

Note that, besides, an organic resin of a negative type (that is, insolubilizes an irradiated portion with light) may be used to form the insulator 107. For example, when the insulator 107 is formed by using negative-type acrylic, although not shown, the edge of the opening 108 is in a S-shaped sectional form. In this case also, it is desirable that a curvature radius of the upper end and the lower end of the opening 108 ranges from 0.2 µm to 2 µm.

In addition, when an insulating film or the like, containing a Si—O bond and a Si—CH$_x$ bonding hand, formed by using a siloxane-based material as a start material is used for the insulator 107, the insulator 107 is etched into a predetermined shape after a photo-exposing process using a photoresist mask; therefore, the opening 108 can be formed. In this case, it is appropriate to use CF$_4$ or a mixed gas of CF$_4$ and O$_2$, He, and Ar for an etching gas.

Note that, when dry etching is carried out on the insulator 107 to form the opening 108, a chemical reaction due to an ashing gas (O$_2$), an etching gas, or other etchant affects the surface of the ITSO layer being in contact with the insulator 107 or inside the layer in vicinity of the surface. Indium or tin, which is a constituent of the ITSO or an oxide thereof, is contained in a gas generated by a chemical reaction and discharged into a reaction space. Accordingly, as can be understood from Table 1 and FIGS. 5A, 5B, 6A and 6B, there is a constant content of Si in the ITSO layer within 1 nm to 5 nm from the surface in depth. Therefore, silicon (Si), silicon oxide (SiOx), silicon nitride (SiNx), silicon oxynitride (SiOxNy), silicon nitride oxide (SiNxOy), and the like can be precipitated on the surface of the ITSO layer or inside the layer in vicinity of the surface, so that the barrier layer containing them as the main component can be formed.

In addition, after forming the opening 108, such a barrier layer can be also formed by intentionally depositing silicon, silicon oxide, silicon nitride, and the like by a vapor deposition method or a sputtering method. By the existence of the barrier layer, the work function of the hole injection electrode increase and a hole injection property is further improved (FIGS. 4A and 4B).

In addition, before forming the organic compound layer 109, the insulator 107 is heated under a vacuum atmosphere to remove absorbed water, oxygen, and the like. Specifically, heat treatment is carried out at temperatures from 100° C. to 200° C. for approximately from 0.5 hour to 1, hour under a vacuum atmosphere. A pressure is preferably set to have $4\times10^{-5}$ Torr or less, and if possible, it is much preferable to have $4\times10^{-6}$ Torr or less. When the organic compound layer is formed after carrying out heat treatment on an organic resin film under a vacuum atmosphere, reliability can be further improved by keeping it under a vacuum atmosphere just before the deposition.

Next, as shown in FIG. 1C, the organic compound layer 109 and the electron injection electrode 110 are sequentially formed over the hole injection electrode 106. The organic compound layer 109 has a structure of a single light-emitting layer or a structure in which a plurality of layers including a light-emitting layer is laminated. In addition, a known material is used for the electron injection electrode 110 as long as it is a conductive film having a small work function, which can be formed by a vapor deposition method. For example, Ca, Al, CaF, MgAg, AlLi, and the like are desirable. In the opening 108 of the insulator 107, the light-emitting element 111 is formed in a region in which the hole injection electrode 106, the organic compound layer 109, and the electron injection electrode 110 are overlapped.

Note that when up to the electron injection electrode 110 is formed, a protective film may be formed to cover the light-emitting element 111. In this case, a film harder to transmit a substance that causes to promote deterioration of a light-emitting element such as water and oxygen than other insulating film is used for the protective film. For example, it is desirable to use a DLC film, a carbon nitride film, a silicon nitride film formed by a RF sputtering method, and the like. In addition, it is also possible that the above-mentioned film that is hard to transmit a substance such as water or oxygen and a film that is easily transmit a substance such as water or oxygen as compared to the film are laminated to use it as the protection film.

Then, it is preferable to carry out packaging (enclosure) with a protective film having high airtightness and having less degas so as not to be exposed to an outside air (a laminate film, an ultraviolet curable resin film, and the like) or a light-transmitting sealing substrate.

Through the above-mentioned steps, a bottom emission light-emitting device in which light from the light-emitting element 111 can be extracted to the side of the substrate 100 can be obtained.

Note that an aluminum film having from 1 nm to 10 nm thick, an aluminum film containing a particle of Li, or the like is used for a cathode. Accordingly, a dual emission light-emitting device in which light from the light-emitting element 111 can be extracted up and down can be obtained. In addition, a top emission light-emitting device in which light from the light-emitting element 111 can be extracted to an opposite side of the substrate (a top side) can be obtained by replacing the hole injection electrode (an anode) 106 and the electron injection electrode (a cathode) 110 with each other, laminating reversely, and reversing polarity of the driving transistor. Even in such cases, a laminated structure of the conductive transparent oxide layers different in a content of a silicon oxide concentration is applied as the hole injection electrode 106. Accordingly, a light-emitting device having high stability can be obtained by the advantageous effect such as improvement in luminous efficiency and low power consumption.

Embodiment 1

Embodiments of a light-emitting element concerning the present invention are specifically described with reference to FIGS. 7A to 7C, 8A and 8B.

In this embodiment, the case in which the invention is applied to an active matrix display device, in which a pixel portion and a driver circuit portion are formed over one substrate, is described.

First, a base insulating film 601 is formed on a substrate 600. A glass substrate, a quartz substrate, a silicon substrate, a metal substrate (Al or the like), a stainless substrate, a plastic substrate that has heat resistance withstanding a processing temperature of a manufacturing process, or the like can be used for the substrate 600. Note that when a plastic substrate that is transformed by a processing temperature of a manufacturing process is used, a method for forming TFTs 607, 609, and 610 preliminary over another substrate (a glass substrate, a quartz substrate, or the like) and transferring them to a plastic substrate through a peeled layer may be applied. Here, a film containing W (tungsten) or $SiO_2$ (for example, a laminated structure made from W, $WO_3$, $SiO_2$, and the like) can be used for the peeled layer.

The base insulating film 601 may be formed of a silicon nitride oxide film (SiNO) of from 10 nm to 100 nm thick by a plasma CVD method. Besides, a silicon oxide film, a silicon nitride film, a silicon oxynitride film may be used or a laminated structure thereof may be applied. A base insulating film may not be necessarily formed.

Next, a semiconductor layer of from 10 nm to 80 nm thick is formed over the base insulating film. Furthermore, after processing the surface with a solution containing nickel, a crystalline silicon semiconductor film is obtained by a step of thermal crystallization at temperatures from 500° C. to 750° C. Moreover, crystallinity is improved by carrying out laser crystallization. Note that a semiconductor film having another amorphous structure such as a silicon germanium (SiGe) alloy may be used for the semiconductor layer. In addition, a sputtering method, a LPCVD method, and the like may be used for the deposition method. A laser crystallization method, a thermal crystallization method, or a thermal crystallization method using other catalysts such as Fe, Ru, Rh, Pd, Os, Ir, Pt, Cu, and Au may be used for the crystallization method, or such methods may be carried out more than once one after the other.

In addition, a continuous-wave laser may be used for the crystallization treatment of a semiconductor film having an amorphous structure. In order to obtain a crystal with a large grain size in crystallizing, a solid state laser capable of continuous wave may be used and it is preferable to apply from a second harmonic to a fourth harmonic of a fundamental wave. Typically, a second harmonic (532 nm) or a third harmonic (355 nm) of a fundamental wave of an $Nd:YVO_4$ laser (a fundamental wave: 1064 nm) may be applied. When a continuous-wave laser is used, laser light emitted from a continuous-wave $YVO_4$ laser of which output is 10 W is converted into a harmonic by a non-linear optical element. In addition, there is a method for emitting a harmonic by putting an $YVO_4$ crystal and a nonlinear optical element in a resonator. Then, the laser light is preferably shaped into a rectangular shape or an ellipse shape in an irradiated surface with an optical system to irradiate a subject. At this time, the energy density ranging approximately from 0.01 $MW/cm^2$ to 100 $MW/cm^2$ (preferably, from 0.1 $MW/cm^2$ to 10 $MW/cm^2$) is needed. Thereafter, the semiconductor film may be irradiated by moving it relatively to the laser light with a speed ranging appropriately from 10 mm/s to 2000 mm/s.

After obtaining the crystalline silicon semiconductor film by the above-mentioned method, an amorphous silicon film for gettering a metal catalyst is formed via an oxide film over the semiconductor film to carry out gettering treatment by heat treatment at temperatures from 500° C. to 750° C.

Furthermore, in order to control a threshold value of a TFT element, a boron ion with a concentration ranging appropriately from $1\times10^{13}$ to $3\times10^{13}$ $atoms/cm^2$ is injected into the crystalline silicon semiconductor film.

Thereafter, the crystalline silicon semiconductor film is patterned by using a first photomask and an island shape crystalline silicon semiconductor film 602 is formed by etching.

As for a semiconductor film constituting a TFT element, a crystalline semiconductor film may be used for the TFT 609 of a pixel portion as well as the TFTs 607 and 610 of a driver circuit portion. Alternatively, an amorphous semiconductor film may be used for a pixel TFT and a crystalline semiconductor film may be used for a driver circuit portion where a high speed operation is required. Here, other semiconductor films having an amorphous structure, for example, amorphous silicon or silicon germanium (SiGe) alloy can be used for the amorphous semiconductor film. In addition, semi-amorphous silicon (SAS) may be used for the crystalline semiconductor film in the driver circuit portion.

Next, after removing the first photomask, an insulating film 603 is formed on the island shape crystalline silicon semiconductor film 602. The insulating film 603 is formed to have a film thickness of from 1 nm to 200 nm by using a plasma CVD method or a sputtering method. It is preferable to carry out surface nitriding treatment using plasma by a microwave after the insulating film containing silicon is formed in a single layer or a laminated structure to have a film thickness of from 10 nm to 50 nm to be thinned.

When an insulating film having such a thin film thickness is formed with a plasma CVD method, it is necessary to obtain a thin film thickness in good controllability by slowing down a deposition rate. For example, a deposition rate of a silicon oxide film can be set to be 6 nm/min under a RF power of 100 W; a frequency, 10 kHz; a pressure, 0.3 Torr; a flow rate of a $N_2O$ gas, 400 sccm; and a flow rate of a $SiH_4$ gas, 1 sccm. In addition, nitriding treatment using plasma by a microwave is carried out by using a microwave source (2.45 GHz) and a nitrogen gas which is a reactive gas.

Note that a nitrogen concentration decreases as the distance from the surface of the insulating film 603 is longer. Accordingly, the silicon oxide surface not only can be nitrided with a high concentration but also nitrogen at an interface between the silicon oxide film and an active layer is decreased, which prevents deterioration of the device property.

Next, a conductive film having a film thickness of from 100 nm to 600 nm is formed over the insulating film 603. Here, a conductive film made of a laminated layer of a TaN film and a W film is formed by using a sputtering method; however, it is not limited thereto and may be formed from an element of Ta, W, Ti, Mo, Al, and Cu; a single layer of an alloy material or a compound material containing the element as the main component; or a lamination thereof. In addition, a semiconductor film typified by a polycrystalline silicon film doped with an impurity element such as phosphorus may be used.

Next, etching is carried out by using a dry etching method or a wet etching method, forming a resist mask by using a second photomask. Through the etching step, gate electrodes 604a and 604b of a TFT in a pixel portion and gate electrodes 605a, 605b, 606a, and 606b of TFTs in a driver circuit portion are obtained.

Next, after removing the resist mask, an impurity element imparting n-type conductivity (typically, phosphorus or arsenic) is doped into a whole area of the semiconductor layer with a low concentration (a first doping step). Then, a resist mask is newly formed by using a third photomask. Here, in order to form the n-channel type TFT 607 among complementary type transistors that forms a driver circuit portion, an impurity element imparting n-type conductivity (typically, phosphorus or arsenic) is doped into a semiconductor with a high concentration (a second doping step). Ion doping is carried out under a condition of an ion dope method, that is, a dose amount ranging from $1 \times 10^{13}$ to $5 \times 10^{15}$ atoms/cm$^2$; and an accelerating voltage, from 60 kV to 100 kV. The resist mask covers a region that serves as a p-channel type TFT and the vicinity of the conductive layer in an n-channel type TFT. Through this second doping step, through dope is carried out by the insulating film 603 to form a high concentration impurity region 613 and a pair of low concentration impurity regions 608 where this doping is not conducted are formed in the n-channel type TFT. One light-emitting element is driven by using a plurality of TFTs; however, when it is driven by only a p-channel type TFT, the above doping step is not specifically needed.

Figure 7A:
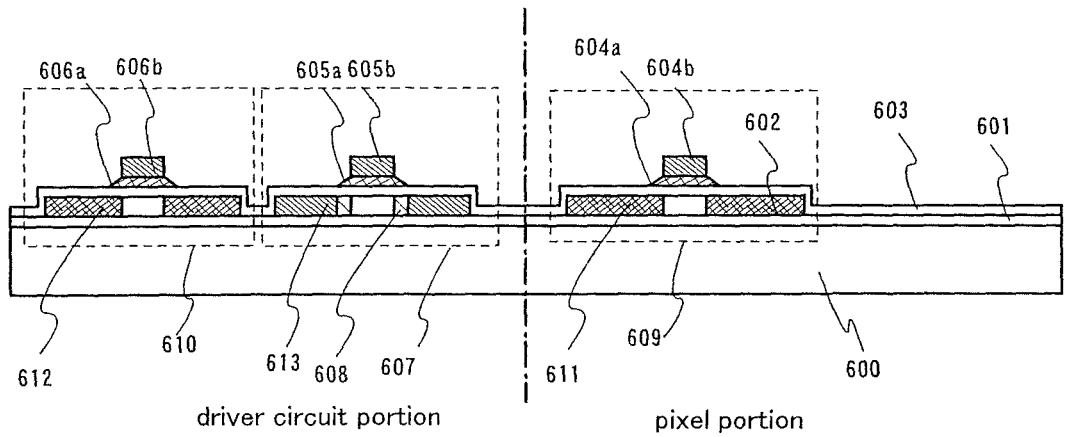
FIGS. 7A to 7C show schematic step views of a peripheral integrated active matrix display device according to the invention.

Next, after removing the resist mask, a resist mask is newly formed by using a fourth photomask. In order to form the p-channel type TFTs 609 and 610, an impurity element imparting p-type conductivity (typically, boron) is doped into a semiconductor with a high concentration (a third doping step). Through the third doping step, through dope is carried out by the insulating film 603 to form a pair of p-type high concentration impurity regions 611 and 612 (FIG. 7A).

Thereafter, after removing the resist mask and forming an insulating film 614 containing hydrogen, activation of the impurity element added into the semiconductor layer and hydrogenation of the semiconductor layer are carried out. A silicon nitride oxide film (SiNO film) obtained by a PCVD method is used for the insulating film 614 containing hydrogen.

Next, a planarizing film 615 serving as an interlayer insulating film is formed. This is a film serving as a base film of a light-emitting element later. An insulating film in which a framework structure is constituted by bonding silicon (Si) and oxygen (O) and which is obtained by an application method is used for the planarizing film 615. For example, a siloxane type polymer can be used. In addition, an inorganic material (silicon oxide, silicon nitride, silicon oxynitride, and the like), a photosensitive or non-photosensitive organic material (polyimide, acrylic, polyamide, polyimidamide, resist or benzocyclobutene), or a SOG film (for example, a SiO$_x$ film containing alkyl) obtained by an application method, or alternatively a laminated layer thereof may be used for the planarizing film 615.

In addition, the planarizing film 615 may be formed by an ink-jet method. A material solution can be saved when an ink-jet method is applied.

In the planarizing film 615 thus formed, reliability of the light-emitting device can be improved by forming an edge or an opening in a taper shape, giving distortion by adding an inert element having a comparably large atomic radius, and reformulating and densifying the surface (including a sidewall), so as to have a structure in which invasion of moisture or oxygen is prevented.

Figure 7B:
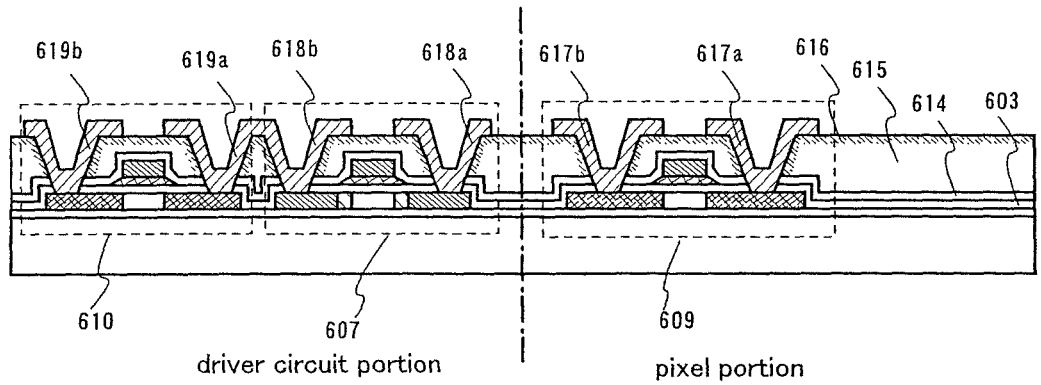

Next, a contact hole is formed in the planarizing film 615 by using a fifth mask and at the same time the planarizing film at a periphery portion is removed by etching. There is no limitation on an etching gas to be used; however, it is appropriate to use CF$_4$, O$_2$, He, and Ar. For example, dry etching is carried out by setting a flow rate of CF$_4$ to be 380 sccm; a flow rate of O$_2$, 290 sccm; a flow rate of He, 500 sccm; a flow rate of Ar, 500 sccm; a RF power, 3000 W; and a pressure, 25 Pa. As shown in FIG. 7B, here, a contact hole in the planarizing film 615 may be formed to have a taper shape. The taper shape may be formed by etching the planarizing film 615 just once or by etching it for several times. Here, a taper shape is formed by carrying out second dry etching, further using CF$_4$, O$_2$, and He setting a flow rate of CF$_4$ to be 550 sccm; a flow rate of O$_2$, 450 sccm; a flow rate of He, 350 sccm; a RF power, 3000 W; and a pressure, 25 Pa.

Next, doping treatment of an inert element is carried out to form a densified portion 616 on the surface of the planarizing film 615. Doping treatment may be carried out with an ion dope method or an ion implantation method. Argon (Ar) is typically used for an inert element. Invasion of moisture or oxygen is prevented by reformulating and densifying the surface (including a sidewall of the contact hole), giving distortion by adding an inert element having a comparably large atomic radius. In addition, an inert element contained in the densified portion 616 has a concentration ranging from $1 \times 10^{19}$ to $5 \times 10^{21}$ atoms/cm$^3$, typically $2 \times 10^{19}$ to $2 \times 10^{21}$ atoms/cm$^3$. Note that the contact hole in the planarizing film 615 has a taper shape so that the surface thereof (including the side surface of the contact hole) is doped. A taper angle is preferable to range from 30° to 75°.

In addition, corona discharge treatment, plasma treatment, or coupling agent treatment may be carried out before and after film formation of the planarizing film 615 to improve adhesion with the layers below and above. Corona discharge treatment, plasma treatment, and coupling agent treatment can be carried out by combining two kinds or more, and at that time, the processing order is not specifically limited.

Next, etching is carried out by using the planarizing film 615 as a mask to remove the exposed insulating films 603 and 614 selectively. CHF$_3$ and Ar are used for an etching gas. Note that an etching time may be increased at a rate of approximately from 10% to 20% to carry out etching without leaving a residue on the semiconductor layer.

Next, after forming a conductive film over the planarizing film 615, etching is carried out by using an sixth mask to form wirings 617a to 619a and 617b to 619b, which is connected to source and drain regions of TFTs 607, 609, and 610 (FIG. 7B).

Next, conductive layers are laminated over the planarizing film 615 and a wiring 617a with a sputtering method by using conductive transparent oxide materials containing silicon or silicon oxide of different concentrations as targets. First, Ar is used as a sputtering gas, and an ITSO layer 620a containing silicon or silicon oxide of a low concentration ranging from 1 atomic % to 6 atomic % is formed by sputtering method, introducing a direct current power. Thereafter, by changing targets, an ITSO layer 620b containing silicon or silicon oxide of a high concentration ranging from 7 atomic % to 15 atomic % is formed. The laminated structure may have a lamination of more than two layers by using different targets as long as the ITSO layer 620b adjacent to an organic compound that severs as a hole injection layer, a hole transport layer, or a light-emitting layer has a high concentration. At this time, it is desirable that the total film thickness of the laminated film ranges from 100 nm to 800 nm. In addition, only ITSO may be used, or a transparent conductive film such as ITO, zinc oxide (ZnO), or IZO in which zinc oxide (ZnO) of from 2 atomic % to 20 atomic % is mixed in indium oxide may be used for the conductive transparent oxide material. For example, the ITSO layer 620a on the side being in contact with the wiring 617a is formed from ITO with low resistance and the conductive layer on the side being in contact with an organic compound layer may be formed from ITSO containing silicon or silicon oxide of a high concentration.

Next, wet etching is carried out on the laminated ITSO layers 620a and 620b to have a predetermined shape through a photo-exposing process using a seventh photoresist mask to form a first electrode 620 (hole injection electrode). A solution or the like in which additives or water ($H_2O$) is added into oxalic acid that is an organic weak acid (HOCO—COOH) may be used for an etchant. Furthermore, after peeling the photoresist mask, heat treatment is carried out at 200° C. for 60 minutes by using an oven.

Next, an insulator 621 (also referred to as a bank, a sidewall, a barrier, an embankment, and the like) covering the edge of the first electrode 620 by using an eighth mask is formed. An insulating film in which a framework structure is constituted by bonding silicon (Si) and oxygen (O) and which is obtained by an application method is used for the insulator 621. The insulator 621 using siloxane-based polymer can be obtained by the same method used for the above-mentioned interlayer insulating film. In addition, an inorganic material (silicon oxide, silicon nitride, silicon oxynitride, and the like), a photosensitive or non-photosensitive organic material (polyimide, acrylic, polyamide, polyimidamide, resist or benzocyclobutene), or a SOG film (for example, a $SiO_x$ film containing alkyl) provided by an application method, or alternatively a laminated layer thereof may be used for the insulator 621.

Next, the insulator 621 is patterned to have a predetermined shape through a photo-exposing process using the photoresist mask to form by etching an opening where a light-emitting element portion is formed later.

Here, when using an inorganic material or a non-photosensitive organic material as the insulator 621 and etching is carried out on the insulator 621, a chemical reaction due to the etchant affects the surface of the ITSO layer being in contact with the insulator 621 or in the layer in vicinity of the surface. Indium (In) or tin (Sn), which is a constituent of the ITSO or an oxide thereof, is contained in a gas generated by a chemical reaction and discharged into a reaction space. Accordingly, silicon oxide (SiOx), silicon nitride (SiNx), silicon oxynitride (SiOxNy), silicon nitride oxide (SiNxOy), and the like can be precipitated by silicon (Si) that exists on the surface of the ITSO layer or in the layer in vicinity of the surface or by a chemical reaction of silicon with an etchant, additives, moisture, an atmospheric constituent, and the like. In addition, a layer containing them as the main component (a barrier layer) can be formed in a self-aligned manner. Such a barrier layer can be also formed by intentionally depositing silicon, silicon oxide, silicon nitride, and the like by a vapor deposition method or a sputtering method. By the existence of the barrier layer, the work function of the hole injection electrode is increased and a hole injection property can be further improved.

Here, when a positive type photosensitive acrylic is used, it is preferable to have a curved surface having a curvature radius only on the upper edge of the insulator. In addition, either a negative type that is insoluble in an etchant due to photosensitive light or a positive type that is soluble in an etchant due to light can be used.

Next, a layer containing an organic compound 622 (also referred to as an electroluminescent layer and hereinafter referred to as an "organic compound layer") is formed by a vapor deposition method or an application method. Note that in order to improve reliability, before forming the organic compound layer 622, it is preferable to use a mercury lamp for a light source, to carry out ultraviolet radiation (UV) irradiation treatment, and further to carry out vacuum heating to deaerate. For example, before carrying out vapor deposition on an organic compound material, it is desirable to carry out heat treatment of temperatures from 200° C. to 300° C. in a low-pressure atmosphere and an inert atmosphere to remove a gas contained in the substrate. When a vapor deposition method is used in forming the organic compound layer 622, vapor deposition is carried out in a film formation chamber in which a vacuum degree is vacuum-evacuated to be $5 \times 10^{-3}$ Torr (0.665 Pa) or less, preferably $10^{-4}$ to $10^{-6}$ Torr. At the vapor deposition, an organic compound, which is previously vaporized by resistance heating, is scattered in the direction of the substrate by opening a shatter during vapor deposition. The vaporized organic compound is scattered above and deposited on the substrate through the opening provided for a metal mask.

For example, white luminescence can be obtained by sequentially laminating $Alq_3$, $Alq_3$ partially doped with a nile red which is a red light-emitting pigment, $Alq_3$, p-EtTAZ, and TPD (aromatic diamine).

In addition, as for the organic compound layer 622, for example, CuPc (20 nm) may be formed as the hole injection layer, molybdenum oxide ($MoO_x$) and α-NPD (40 nm) may be formed as the hole transport layer, $Alq_3$: DMQd (375 nm) (DMQd: quinacridon derivative) may be formed as the light-emitting layer, and $Alq_3$ (375 nm) may be formed as the electron transport layer.

In addition, when the organic compound layer 622 is formed by an application method using spin coating, after application, it is desirable to be baked with vacuum heating. For example, poly(ethylene dioxythiophene)/poly(styrenesulfonic acid) solution (PEDOT/PSS) acting as a hole injection layer is applied over an entire surface and baked. Thereafter, polyvinyl carbazole (PVK) doped with a light-emitting center pigment acting as a luminescence center pigment (1,1, 4,4-tetrapheny-1,3-butadiene (TPB), 4-dicyanomethylene-2-methyl-6-(p-dimethylamine-styryl)-4H-pyran (DCM1), nile red, coumalin 6, or the like) may be applied over the entire surface and baked. Note that water is used for a solvent of PEDOT/PSS, which is not soluble in an organic solvent. Accordingly, there is no concern that the PEDOT/PSS dissolves again even when PVK is applied thereover. In addition, PEDOT/PSS and PVK have different solvents; therefore, it is preferable not to use the same film formation chamber. The organic compound layer 622 can be formed in a single-layer, and 1,3,4-oxadiazole derivative (PBD) in electron transportability may be dispersed in polyvinyl carbazole (PVK) in hole transportability. In addition, white luminescence is obtained by dispersing PBD of 30 wt % as an electron transport agent and by dispersing four kinds of pigments (TPB, coumalin 6, DCM1, and nile red) in an appropriate amount.

In addition, the organic compound layer 622 may be separately coated in R, G, and B to have a full-color display in one panel.

Next, a second electrode (an electron injection electrode, a cathode) 623 made of a conductive film is formed. An alloy such as MgAg, MgIn, AlLi, $CaF_2$, or CaN or a film laminated with Al over a film made of the alloy can be used for the second electrode 623. Alternatively, a film formed from an element belonging to Group 1 or 2 of the periodic table and aluminum by a co-evaporation method may be used.

Figure 9A:
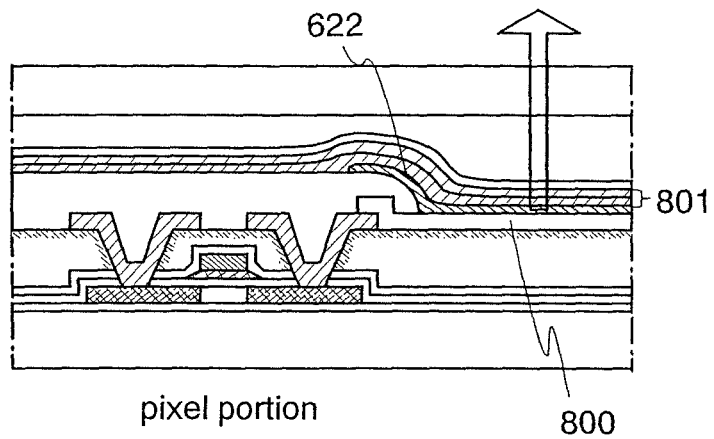
FIGS. 9A to 9C show schematic views of a top emission type, bottom emission type, and dual emission type display devices, respectively, according to the invention.
Figure 9B:
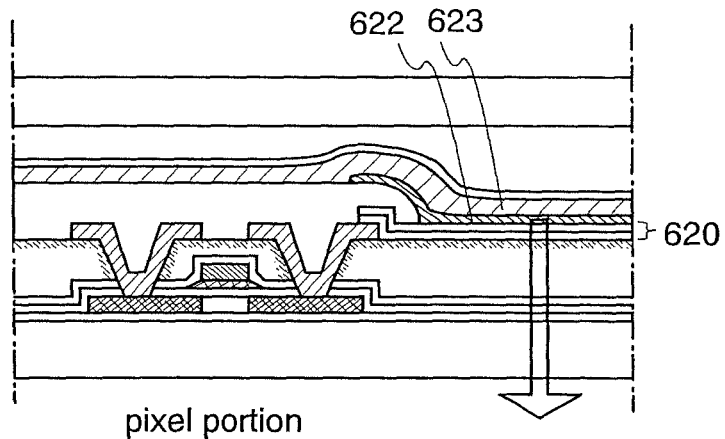
Figure 9C:
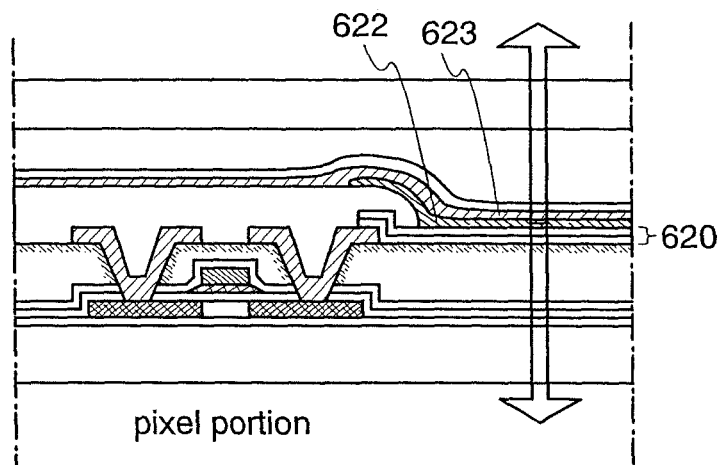

When a top emission type light-emitting device that emits light by passing the second electrode as shown in FIG. 9A is formed or when a dual emission type light-emitting device shown in FIG. 9C is formed, an aluminum film having a film thickness of from 1 nm to 10 nm or an aluminum film containing a particle of Li is used for the second electrode. In addition, a light-transmitting layer made from $CaF_2$, $MgF_2$, or $BaF_2$ (a 1 nm to 5 nm thick) may be formed as a cathode buffer layer before forming the aluminum film having a film thickness of from 1 nm to 10 nm.

Figure 7C:
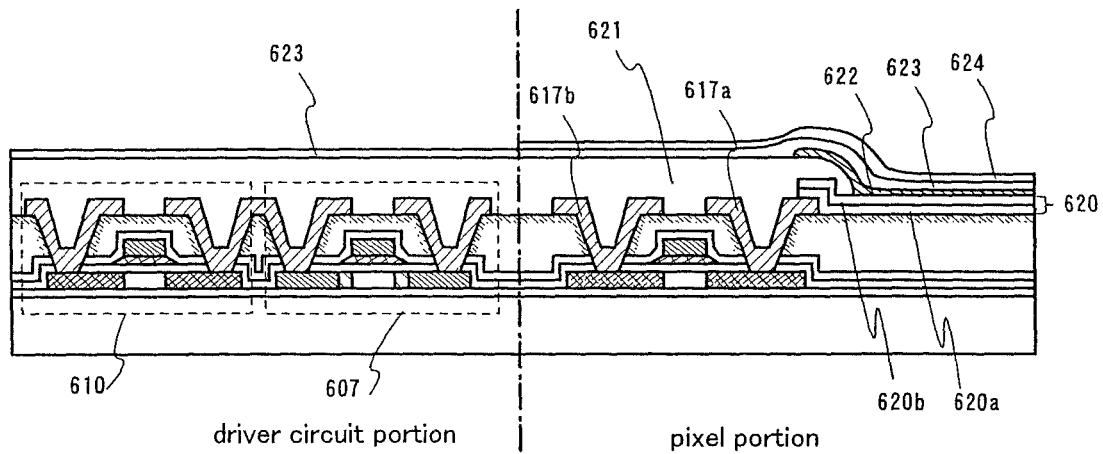

Next, a transparent protective layer 624 is formed by a vapor deposition method or a sputtering method. The transparent protective layer 624 serves to protect the second electrode 623 (FIG. 7C).

Next, a sealing substrate 700 is attached with a sealant 701 to seal a light-emitting element. The sealant 701 is attached to cover an edge (a tapered portion) of the planarizing film 615. Note that a transparent filler 702 is filled in a region surrounded with the sealant 701. A material of the transparent filler 702 has no limitation as long as it is a light-transmitting material, and typically, an ultraviolet curing or heat curing epoxy resin may be used. Here, a high-thermostable UV epoxy resin having a refractive index of 1.50; a viscosity, 500 cps; a Shore D hardness, 90; a tensile strength, 3000 psi; a Tg point, 150° C.; a volume resistance, $1 \times 10^{15} \Omega \cdot cm$; and a dielectric strength, 450 V/min (a product made by Electrolight Co. Ltd.: 2500 Clear) is used. In addition, an entire transmittance can be improved by filling the filler 702 between a pair of the substrates.

Lastly, a FPC 703 (Flexible Print Circuit) is attached to a terminal electrode 705 with a known method by an anisotropic conductive film 704. It is preferable to use a transparent conductive film for the terminal electrode 705, which is formed over electrodes 706a and 706b formed simultaneously with the gate wiring (FIGS. 8A and 8B).

In addition, a driver circuit portion composed of the n-channel type TFT 607 and the p-channel type TFT 610 is partially shown in FIG. 8A. In addition, a state in which the second electrode 623 and a wiring 707 are being in contact with each other is shown in FIG. 8B. The wiring 707 is connected to the electrodes 706a and 706b.

In the active matrix type light-emitting device thus manufactured, a laminated structure of conductive transparent oxide layers containing silicon or silicon oxide is applied to the first electrode 620. A silicon oxide concentration of the conductive layer on the side of the organic compound layer 622 is made to have a high concentration (preferably from 7 atomic % to 15 atomic %); therefore, hole injection efficiency to a hole injection layer is increased and luminous efficiency can be improved. Therefore, a display device having high stability can be obtained. In addition, a silicon oxide concentration of the conductive layer on the side of the wiring 617a is made to have a low concentration (preferably from 1 atomic % to 6 atomic %); therefore, the resistance can be reduced and a display device having high stability can be obtained.

Embodiment 2

The case to which the present invention is applied in a bottom emission type light-emitting device shown in FIG. 9B is described in Embodiment 1. The case to which the invention is applied in a top emission type light-emitting device shown in FIG. 9A and a dual emission type light-emitting device shown in FIG. 9C is described in this embodiment.

First, the case of the dual emission type light-emitting device is described. In this case and Embodiment 1 alike, as a material of a hole injection electrode, conductive transparent oxide layer, containing silicon or silicon oxide, such as ITO, zinc oxide (ZnO), or IZO can be used by laminating. It is preferable to use ITSO containing silicon or silicon oxide of which concentration ranges from 0% to 20 atomic % and further to use a lamination of an ITSO layer containing silicon or silicon oxide of a low concentration (more preferably, from 1 atomic % to 6 atomic %) and an ITSO layer containing silicon or silicon oxide of a high concentration (more preferably, from 7 atomic % to 15 atomic %).

On the other hand, a dual emission type light-emitting device in which light from a light-emitting element can be extracted up and down can be obtained by using a thin aluminum film having a film thickness of from 1 nm to 10 nm, an aluminum film containing a particle of Li, or the like for an electron injection electrode (a cathode) 623 to transmit light from a organic compound layer (FIG. 9C).

Note that a dual emission type light-emitting device can be obtained even by applying the same material as a hole injection electrode (an anode) 623, that is, a conductive transparent oxide layer such as ITSO to an electron injection electrode (a cathode) 620. In this case, the conductive transparent oxide layer may be used by containing silicon or silicon oxide or a laminated structure may be applied like a hole injection electrode (a cathode) 620.

Next, the case of a top emission type light-emitting device is described with reference to FIG. 9A. Generally, a top emission type light-emitting device which can extract light from a light-emitting element to a substrate side and an opposite side (upside) can be obtained by exchanging a first electrode 620 (an anode; a hole injection electrode) and a second electrode 623 (a cathode; an electron injection electrode) and further by reversing a polarity of a driving transistor and reversely laminating an organic compound layer (an n-channel type TFT is used here). In addition, when the electrodes and the organic compound layer are reversely laminated as shown in FIG. 9A, a laminated structure of conductive transparent oxide layers different in a content of a silicon or silicon oxide concentration is applied as a hole injection electrode 801. Accordingly, a light-emitting device having high stability can be obtained by an advantageous effect such as improvement in luminous efficiency or reduction in power consumption. Here, a metal electrode with light reflectivity or the like may be used for an electron injection electrode 800 (cathode).

Note that a top emission type light-emitting device can be obtained without exchanging the first electrode 620 and the second electrode 623 by applying a conductive transparent oxide layer such as ITSO to the second electrode 623. A conductive transparent oxide layer containing silicon or silicon oxide may be used or a laminated structure thereof may be applied for a conductive transparent oxide layer used for this electron injection electrode (cathode).

Embodiment 3

The case applying the present invention to an active matrix type light-emitting device having a reverse stagger structure is described in this embodiment with reference to FIGS. 10A-10D and 11.

A conductive film for forming a gate electrode and a gate wiring (a scanning line) is formed over a substrate 1100 made from the same material as that of Embodiment 1. A metal material such as chromium, molybdenum, titanium, tantalum, tungsten, or aluminum or the alloy material thereof is used for the conductive film. This conductive film can be formed by a sputtering method and a vapor deposition method.

A conductive film is etched to form gate electrodes 1101 and 1102. Since a first semiconductor film and a wiring layer are formed over the gate electrodes 1101 and 1102, it is preferable that the conductive film is processed so that the edge thereof has a taper shape. When the conductive film is formed from a material containing aluminum as the main component, the surface may be insulated by anodizing or the like after etching process. Though not shown, a wiring connecting to the gate electrodes can be simultaneously formed in this step:

A first insulating film 1103 and a second insulating film 1104 can be functioned as gate insulating films by being formed over the gate electrodes 1101 and 1102. In this case, it is preferable to form a silicon oxide film as the first insulating film 1103 and silicon nitride film as the second insulating film 1104. These insulating films can be formed by a glow discharge decomposition method and a sputtering method. Specifically, a rare gas such as argon may be contained in a reactive gas and mixed into insulating films to be formed to form a few dense insulating films under a gate leak current at a low deposition temperature.

Next, a first semiconductor film 1105 is formed over the first and the second insulating films 1103 and 1104. The first semiconductor film 1105 is formed of a semi-amorphous semiconductor (SAS).

This SAS can be obtained by carrying out grow discharge decomposition on a silicide gas. A typical silicide gas is $SiH_4$, and besides, $Si_2H_6$, $SiH_2Cl_2$, $SiHCl_3$, $SiCl_4$, $SiF_4$, and the like can be used. The SAS can be easily formed by using this silicide gas by diluting with one or more kinds of a rare gas of hydrogen, hydrogen and helium, argon, krypton, and neon. It is preferable to dilute the silicide gas with a dilution rate ranging from 10 times to 1000 times. Of course, reaction of film to be formed by grow discharge decomposition is generated under a low pressure, and the pressure may be carried out, ranging approximately from 0.1 Pa to 133 Pa. High-frequency power ranging from 1 MHz to 120 MHz, preferably from 13 MHz to 60 MHz may be supplied to a power for forming glow discharge. A heating temperature of a substrate is preferable to be 300° C. or less and temperatures from 100° C. to 200° C. is recommended.

In addition, an energy bandwidth may be adjusted to range from 1.5 eV to 2.4 eV or from 0.9 eV to 1.1 eV by mixing a gaseous carbide such as $CH_4$ or $C_2H_6$ and a germanium gas such as $GeH_4$ or $GeF_4$ into a silicide gas.

In addition, a SAS shows low electrical conductivity of n-type when an impurity element to control a valance electron is not added intentionally. This is because oxygen is likely to be contained in a semiconductor film since glow discharge of higher power is carried out than when an amorphous semiconductor is formed. Thus, it is possible to control a threshold value by adding an impurity element imparting p-type conductivity to the first semiconductor film which provides a channel formation region of a TFT at the same time as this deposition or after the deposition. An impurity element imparting p-type conductivity is typically boron and an impurity gas such as $B_2H_6$ or $BF_3$ ranging from 1 ppm to 1000 ppm in its rate may be contained in a silicide gas. For example, when boron is used as an impurity element imparting p-type conductivity, the concentration of boron may range from $1\times10^{14}$ to $6\times10^{16}$ atoms/$cm^3$.

Next, a second semiconductor film 1106 and a third semiconductor film 1107 are formed. The second semiconductor film 1106 is formed without adding an impurity element to control a valance electron intentionally, and it is preferable to be formed of a SAS as well as the first semiconductor film 1105. This second semiconductor film 1106 serves like a buffer layer by forming between the semiconductor film 1107 having one conductivity type that forms source and drain regions and the semiconductor film 1105. Therefore, when the third semiconductor film 1107 having an n-type conductivity is formed on the first semiconductor film 1105 having low n-type electrical conductivity, the second semiconductor film 1106 is not necessarily needed. When an impurity element imparting p-type conductivity is added into an object of controlling a threshold value, the second semiconductor film 1106 has an advantageous effect of changing an impurity concentration step by step, which becomes preferable forming in making junction formation. That is, it is possible to give a function as a low concentration impurity region (LDD region) formed between a channel formation region and source and drain regions inside a TFT to be formed.

When forming an n-channel-type TFT, phosphorus may be added as a typical impurity element into the third semiconductor film 1107 having one conductivity type, and an impurity gas such as $PH_3$ may be added into a silicide gas. Except that a valance electron is controlled; the third semiconductor film 1107 having one conductivity type is formed of a semiconductor like a SAS or an amorphous semiconductor.

Figure 10A:
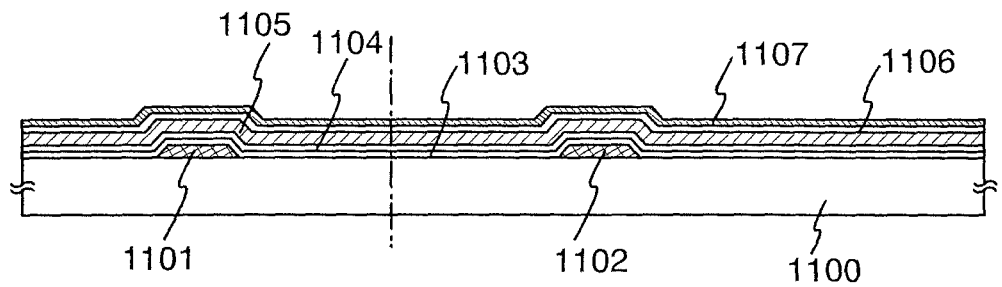
FIGS. 10A to 10D show schematic step views showing the case of applying the invention to a display device using a channel etch type transistor.

As mentioned above, it is possible to continuously form the first insulating film 1103 to the third semiconductor film 1107 having one conductivity type without exposing to the atmosphere. That is, each layered interface can be formed without being polluted by an atmospheric constituent and an airborne polluted impurity element that is floated in an atmosphere; therefore, variation in a property of a TFT can be reduced (FIG. 10A).

Next, a photoresist mask is formed to etch the first semiconductor film 1105, the second semiconductor film 1106, and the third semiconductor film 1107 having one conductivity type, which is separated and formed in an island shape.

Thereafter, a second conductive film for forming a wiring connecting to the source and drain regions is formed. A second conductive film 720 is formed from aluminum or a conductive material containing aluminum as the main component. However, the layer on the side being in contact with the semiconductor film may be formed from titanium, tantalum, molybdenum, tungsten, copper, or a laminated structure formed from nitride of such elements may be applied. For example, the combination that the first layer is Ta and the second layer is W; the first layer, TaN, the second layer, Al; the first layer, TaN, the second layer, Cu; the first layer, Ti, the second layer, Al, the third layer, Ti may be also applied. In addition, an AgPdCu alloy may be used either for the first layer or for the second layer. A three-layered structure sequentially laminating W, an alloy of Al and Si (Al—Si), and TiN may be applied. Tungsten nitride may be used instead of W, an alloy film of Al and Ti (Al—Ti) may be used instead of an alloy of Al and Si (Al—Si), and Ti may be used instead of TiN. An element such as titanium, silicon, scandium, neodymium, or copper ranging from 0.5 atomic % to 5 atomic % may be added into aluminum to improve heat resistance.

Figure 10B:
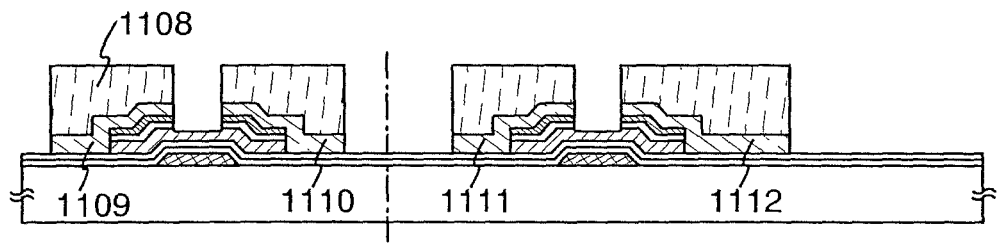

Next, a mask 1108 is formed. The mask 1108 is a mask that is formed in a pattern to form a wiring being in contact with the source and drain regions. Simultaneously it is jointly used as an etching mask to form the channel formation region by removing the third semiconductor film 1107 having one conductivity type. The aluminum film or the conductive film containing it as the main component may be etched by using a chloride gas such as $BCl_3$ or $Cl_2$. Wirings 1109 to 1112 are formed through this etching process. In addition, etching is carried out by using a fluoride gas such as $SF_6$, $NF_3$, or $CF_4$ for etching to form the channel formation region. However, in this case, etching selective ratio to the first semiconductor film 1105 that serves as a base cannot be obtained; therefore, etching is carried out by appropriately adjusting the processing time. As mentioned above, a structure of a channel etch type TFT can be formed (FIG. 10B).

Next, a third insulating film 1113 to protect the channel formation region is formed of a silicon nitride film. This silicon nitride film can be formed with a sputtering method or a glow discharge decomposition method, which is to prevent penetration of an airborne polluted impurity such as organic substance, metal, or vapor which is floated in atmosphere, and which is required to be a dense film. An oxygen concentration in the first semiconductor film 1105 can be controlled to $5 \times 10^{19}$ atoms/cm$^3$ or less, preferably $1 \times 10^{19}$ atoms/cm$^3$ or less by using the silicon nitride film for the insulating film 1113. In this object, using silicon as a target, in a silicon nitride film sputtered in a high frequency with a sputtering gas in which a rare gas element such as nitrogen and argon is mixed, densification is promoted by containing the rare gas element. In a glow discharge decomposition method also, a silicon nitride film which is formed by diluting a silicide gas by 100 times to 500 times with a silicide gas such as argon is preferable since the dense film can be formed even at a low temperature of 100° C. or less. Furthermore, a fourth insulating film 1114 may be formed by laminating a silicon oxide film, if necessary. The third insulating film 1113 and the fourth insulating film 1114 correspond to a passivation film.

A planarizing film 1115 that is a fifth insulating film is formed as preferable mode over the third insulating film 113 and/or the fourth insulating film 1114. The planarizing film is preferably formed of an organic resin such as acrylic, polyimide, or polyamide an insulating film containing a Si—O bond and a Si—CH$_x$ bonding hand formed by using a siloxane-based material. These materials contain moisture; therefore, it is preferable to provide a sixth insulating film 1116 as a barrier film preventing intrusion and release of moisture. The silicon nitride film as mentioned above may be applied to the sixth insulating film 1116.

After forming a contact hole in the sixth insulating film 1116, the planarizing film 1115, the third insulating film 1113, and the fourth insulating film 1114, a wiring 1117 is etched to be formed in a desired shape.

The channel etch type TFT formed as mentioned above can obtain electric field effect mobility ranging from 2 cm$^2$/V·sec to 10 cm$^2$/V·sec by having a structure of a channel formation region with a SAS.

Figure 10C:
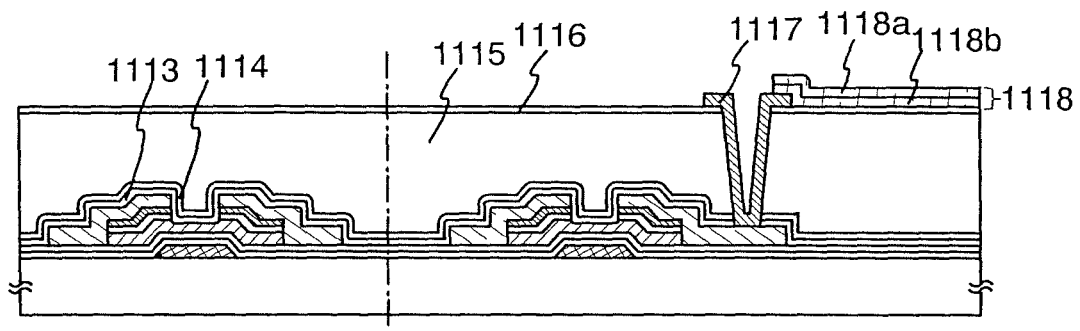

Next, conductive layers 1118a and 1118b containing silicon or silicon oxide are laminated over the sixth insulating film 1116 to be in contact with the wiring 1117 and are etched in a desired shape to form a hole injection electrode (an anode) 1118. It is preferable that a silicon or silicon oxide concentration of the conductive layer 1118a is a low concentration (1 atomic % to 6 atomic %) and a silicon or silicon oxide concentration of the conductive layer 1118b is a high concentration (7 atomic % to 15 atomic %). In addition, IZO containing zinc may be used in addition to ITSO for the conductive layer containing silicon or silicon oxide, and the conductive layer 1118a to be in contact with the wiring 1117 may be formed from ITO. The hole injection electrode 1118 may be cleaned or polished with a CMP method or a method using a polyvinyl alcohol-based porous material so that the surface thereof is flattened. In addition, after polishing using a CMP method, ultraviolet ray irradiation, oxygen plasma treatment, and the like may be carried out on the surface of the hole injection electrode 1118 (FIG. 10C).

Figure 2A:
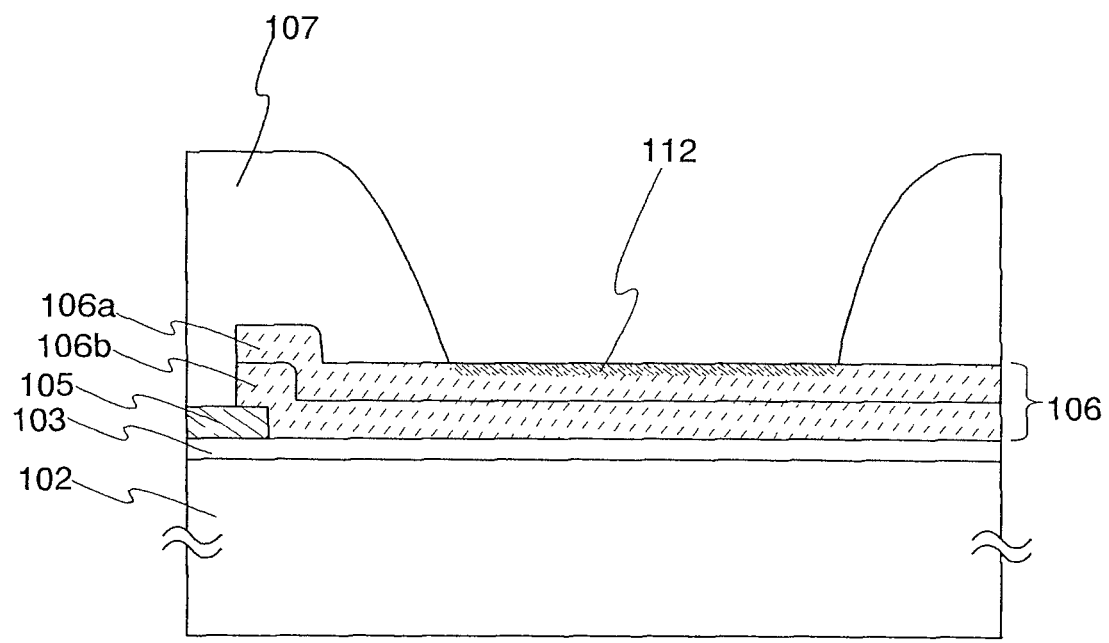
FIGS. 2A and 2B show enlarged views of a light-emitting element portion of a display device according to the invention.
Figure 2B:
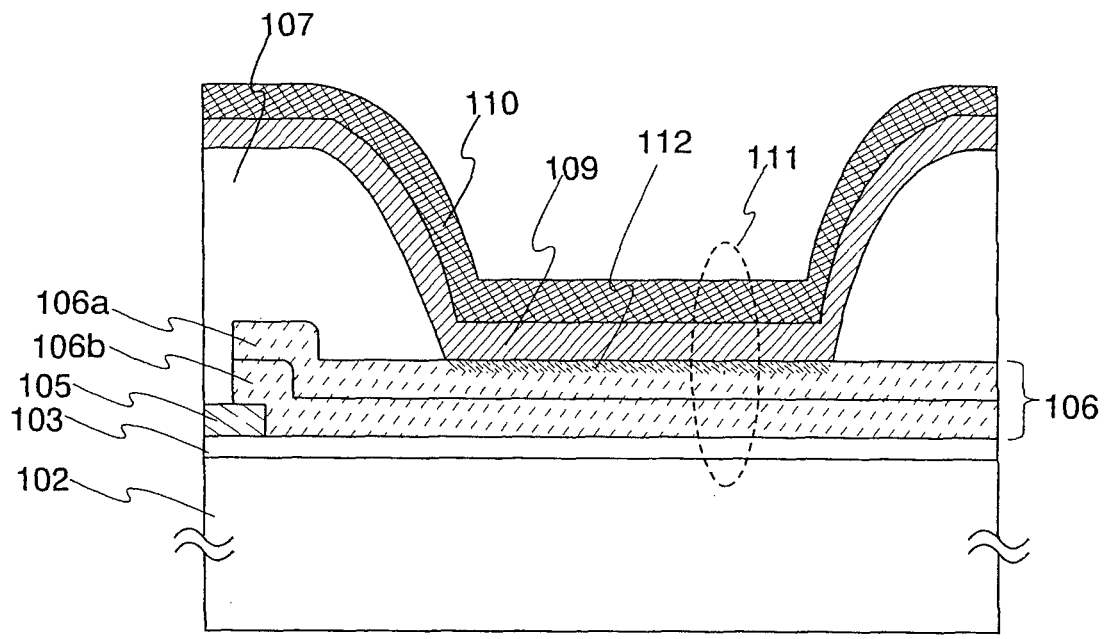
Figure 3:
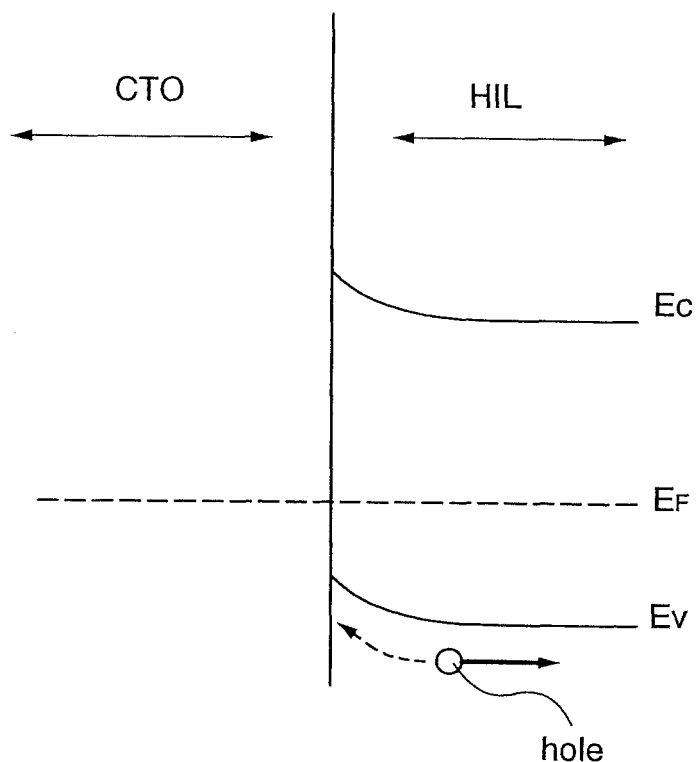
FIG. 3 shows a view of a band scheme showing a conventional contact condition of a conductive layer and a hole injection layer.

Note that indium, tin, or an oxide thereof is discharged from an inside of the conductive layer 1118b through a step of peeling a photo resist mask, a step of hydro washing, a step of ultraviolet ray irradiation, or the like after etching to form the hole injection electrode 1118. Therefore, silicon, silicon oxide, silicon nitride, and the like are precipitated on the surface of the conductive layer 1118b or in the layer in vicinity of the surface to be able to form a barrier layer containing them as the main component (FIGS. 2A and 2B). In addition, this barrier layer may intentionally form silicon, silicon oxide, silicon nitride, and the like by a vapor deposition method, a sputtering method, and the like. By the existence of the barrier layer, the work function of the hole injection electrode increases and the hole injection property is improved (FIGS. 4A and 4B).

Figure 10D:
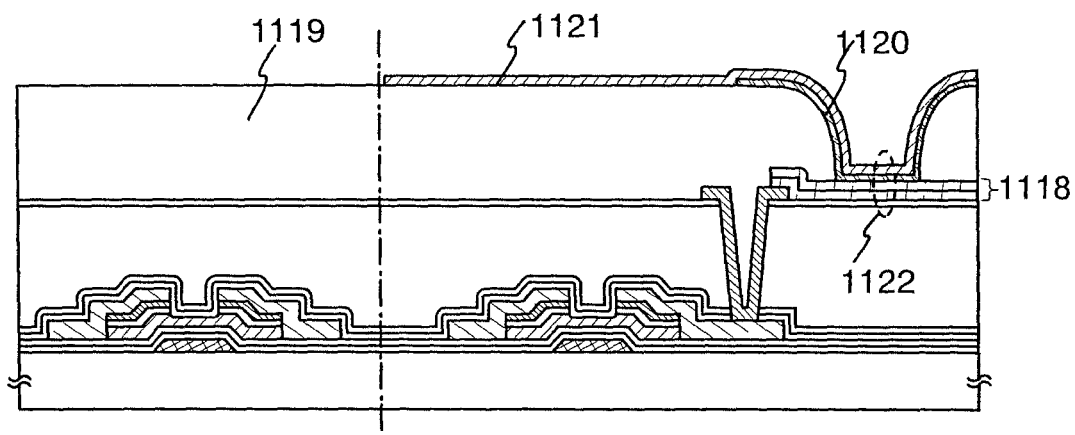

Next, as shown in FIG. 10D, a bank 1119 formed by using an organic resin film, an inorganic insulating film, or siloxane is formed over the sixth insulating film 1116. Note that siloxane refers to a material, in which a framework structure is constituted by bonding silicon (Si) and oxygen (O), at least containing hydrogen in a substituent. In addition to the above structure, at least one kind of fluorine, alkyl, or aromatic hydrocarbon may be included in the substituent. The bank 1119 has an opening, and the hole injection electrode 1118 is exposed in the opening. Next, a layer containing an organic compound (also referred to as an electroluminescent layer and hereinafter just referred to as an "organic compound layer") 1120 is formed to be in contact with a hole injection electrode (an anode) 1118 in the opening of the bank 1119. The organic compound layer 1120 may be composed of a single layer or composed by laminating a plurality of layers. In consisting a plurality of layers, it is laminated in the order of a hole injection layer, a hole transport layer, a light-emitting layer, an electron transport layer, and an electron injection layer over the hole injection electrode 1118.

Next, an electron injection electrode (a cathode) 1121 is formed to cover the organic compound layer 1120. A known material having a small work function, for example, Ca, Al, CaF, MgAg, AlLi, and the like can be used for the electron injection electrode 1121. The hole injection electrode 1118, the organic compound layer 1120, and the electron injection electrode 1121 overlap with each other in the opening of the bank 1119; therefore, a light-emitting element 1122 is formed (FIG. 10D).

Actually, as completed in the condition of FIG. 10D, it is preferable to carry out packaging (enclosure) with a protective film having high airtightness and having less degas so as not to be exposed to an outside air (a laminate film, an ultraviolet curable resin film, and the like) or a cover material.

Such an element substrate using same polarity type TFTs in a pixel portion and a driver circuit portion can be formed of a total of five masks including a gate electrode forming mask, a semiconductor region forming mask, a wiring forming mask, a contact hole forming mask, and a hole injection electrode (an anode) forming mask.

Note that an example of forming a driver circuit portion and a pixel portion of a light-emitting device over one substrate with a TFT using a semi-amorphous semiconductor is described in this embodiment; however, the invention is not limited thereto. By forming a pixel portion with a TFT using a semi-amorphous semiconductor, a driver circuit separately formed may be attached to a substrate where the pixel portion is formed.

Figure 11:
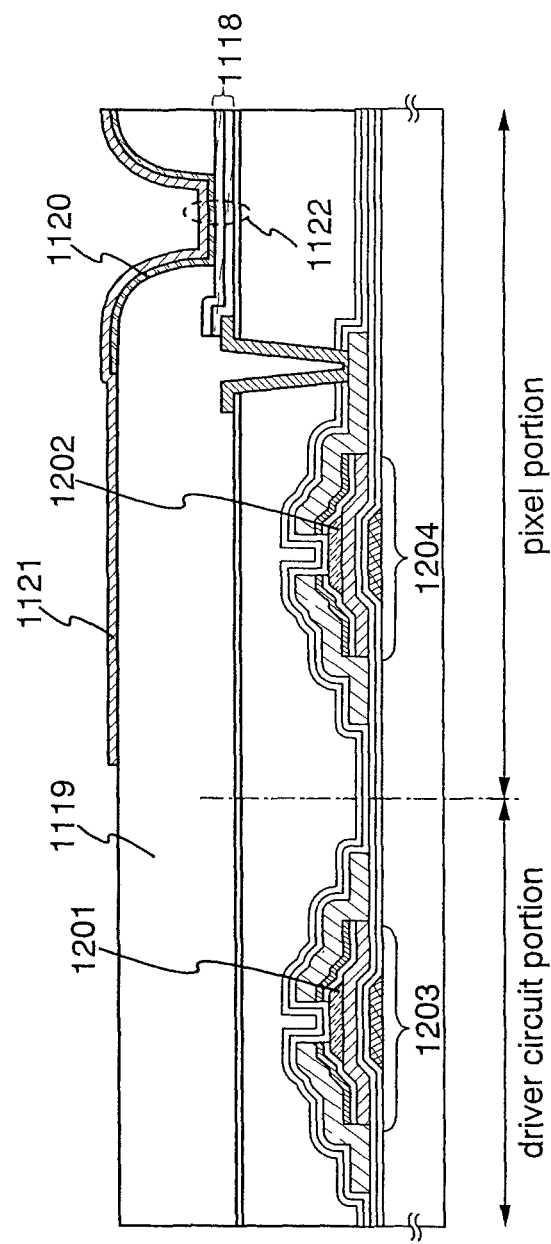
FIG. 11 shows a schematic step view showing the case of applying the invention to a display device using a channel stop type transistor.

When channel protective films 1201 and 1202 are formed on the first semiconductor film 1105 formed of a SAS by superposing the gate electrodes 1101 and 1102, a light-emitting device using so-called channel stop type TFTs 1203 and 1204 having a structure shown in FIG. 11 can be manufactured in the same manner.

Embodiment 4

The case applying the present invention to a passive type display device is described in this embodiment with reference to FIG. 12.

First, a conductive layer is laminated over a substrate 900 by a sputtering method, using two targets or more containing silicon or silicon oxide ranging from 0% to 20 atomic % in ITO. At this time, a target is selected in a conductive layer 901b on the side of an organic compound layer so that silicon oxide with a higher concentration than that of other conductive layer 901a is contained. It is preferable that a conductive layer 901a on the side of the substrate 900 contains silicon or silicon oxide ranging from 1 atomic % to 6 atomic % and a conductive layer 901b on the side of the organic compound layer contains silicon or silicon oxide ranging from 7 atomic % to 15 atomic %.

Next, the laminated conductive layers are etched by using a mask to form a hole injection electrode 901 (an anode) in a stripe shape.

Here, a glass substrate, a quartz substrate, a silicon substrate, a metal substrate, a stainless substrate, a plastic substrate that has heat resistance withstanding a processing temperature of a manufacturing process, or the like can be used for the substrate 900.

In addition, a transparent conductive film containing silicon or silicon oxide in IZO, GZO, and the like in addition to the above ITSO may be used for the material of the hole injection electrode 901. A conductive transparent oxide layer containing carbon in a conductive film such as the ITO or the ITSO as mentioned above may be also used. The hole injection electrode 901 may be cleaned or polished with a CMP method or a method using a polyvinyl alcohol-based porous material so that the surface thereof is flatten. In addition, after polishing using a CMP method, ultraviolet ray irradiation, oxygen plasma treatment, or the like may be carried out on the surface of the hole injection electrode 901.

Next, a layer containing an organic compound (hereinafter just referred to as an "organic compound layer") 902 is formed over the hole injection electrode 901 by a vapor deposition method or an application method. Note that in order to improve reliability, before forming the organic compound layer 902, it is preferable to use a mercury lamp for a light source, to carry out ultraviolet radiation (UN) irradiation treatment, and further to carry out vacuum heating to deaerate. For example, before carrying out vapor deposition on an organic compound material, it is desirable to carry out heat treatment of temperatures from 200° C. to 300° C. in a low-pressure atmosphere and an inert atmosphere to remove a gas contained in the substrate. When a vapor deposition method is used in forming the organic compound layer 902, vapor deposition is carried out in a film formation chamber in which a vacuum degree is vacuum-evacuated to be $5 \times 10^{-3}$ Torr (0.665 Pa) or less, preferably $10^{-4}$ to $10^{-6}$ Torr. At the vapor deposition, an organic compound, which is previously vaporized by resistance heating, is scattered in the direction of the substrate by opening a shatter during vapor deposition. The vaporized organic compound is scattered and deposited on the substrate through the opening provided for a metal mask.

For example, white luminescence can be obtained by sequentially laminating $Alq_3$, $Alq_3$ partially doped with a nile red which is a red light-emitting pigment, $Alq_3$, p-EtTAZ, and TPD (aromatic diamine).

In addition, as for the organic compound layer 902, for example, CuPc (20 nm) may be formed as the hole injection layer, molybdenum oxide ($MoO_x$) and α-NPD (40 nm) may be formed as the hole transport layer, $Alq_3$: DMQd (375 nm) (DMQd: quinacridon derivative) may be formed as the light-emitting layer, and $Alq_3$ (375 nm) may be formed as the electron transport layer.

In addition, when the organic compound layer 902 is formed by an application method using spin coating, after application, it is desirable to be baked with vacuum heating. For example, poly(ethylene dioxythiophene)/poly(styrene-sulfonic acid) solution (PEDOT/PSS) acting as a hole injection layer is applied over the entire surface and baked. Thereafter, polyvinyl carbazole (PVK) doped with a light-emitting center pigment acting as a luminescence center pigment (1,1,4,4-tetrapheny-1,3-butadiene (TPB), 4-dicyanomethylene-2-methyl-6-(p-dimethylamine-styryl)-4H-pyran (DCM1), nile red, coumalin 6, and the like) may be applied over the entire surface and baked. Note that water is used for a solvent of PEDOT/PSS, which is not soluble in an organic solvent. Accordingly, there is no concern that the PEDOT/PSS dissolves again even when PVK is applied thereover. In addition, PEDOT/PSS and PVK have different solvents; therefore, it is preferable not to use the same film formation chamber. The organic compound layer 902 can be formed in a single-layer, and 1,3,4-oxadiazole derivative (PBD) having electron transportability may be dispersed in polyvinyl carbazole (PVK) having hole transportability. In addition, white luminescence is obtained by dispersing PBD of 30 wt % as an electron transport agent and by dispersing four kinds of pigments (TPB, coumalin 6, DCM1, and nile red) in an appropriate amount.

In addition, the organic compound layer 622 may be separately coated in R, G, and B to have a full-color display in one panel.

Next, an electron injection electrode 903 (a cathode) in a stripe shape perpendicular to the hole injection electrode 901 is etched to be formed over an opposite substrate 904 and attached to the substrate 900 over which the hole injection electrode 901 and the organic compound layer 902 are formed. An alloy such as MgAg, MgIn, AlLi, $CaF_2$, or CaN or a film laminated with Al over a film made of the alloy can be used for the electron injection electrode 903. Alternatively, a film formed from an element belonging to Group 1 or 2 of the periodic table and aluminum by a co-evaporation method may be used.

Next, a driver IC to control a hole injection electrode (an anode) and an electron injection electrode (a cathode) is connected and a passive type display device capable of a display by a line sequential scanning can be obtained.

In a passive type display device, since luminance in all pixels has to be maintained in its luminance to maintain desired luminance in an entire display device, there is a defect that momentary luminance gets higher and the consumption power gets larger. Accordingly, in the passive type display device, lifetime of a light-emitting element tends to shorten. However, according to the invention, the above defect of a passive type display device can be relieved by using a conductive transparent oxide layer containing silicon or silicon oxide as the hole injection electrode 901; therefore, a display device having high stability with low power consumption and long-life time can be obtained.

The invention can provide in high yield a display device having high luminous efficiency, achieving brightness with low power consumption, and having high stability by applying a laminated structure of conductive layers such as ITSO containing a different silicon or silicon oxide concentration as a hole injection electrode of a light-emitting element. In addition, a display device having much higher luminous efficiency can be obtained by forming a barrier layer containing silicon, silicon oxide, silicon nitride, and the like as the main component over a conductive layer.

The invention having these advantageous effects can be applied either to an active matrix type display device or to a passive type display device as shown in embodiments. In addition, the invention can be applied regardless of a kind of a top emission type, a bottom emission type, and a dual emission type, and the application range is extremely broad.

This application is based on Japanese Patent Application serial no. 2003-329201 filed in Japanese Patent Office on Sep. 19 in 2003, the contents of which are hereby incorporated by reference.

What is claimed is:

1. A method for manufacturing a display device comprising the steps of:
    forming a hole injection layer by laminating a first conductive layer and a second conductive layer, the hole injection layer being over a first electrode; and
    forming an electroluminescent layer over the hole injection layer,
    wherein a silicon or a silicon oxide concentration of the second conductive layer is higher than that of the first conductive layer.

2. The method for manufacturing the display device according to claim 1, wherein each of the first conductive layer and the second conductive layer contains one selected from the group consisting of indium tin oxide, zinc oxide, indium zinc oxide, and zinc oxide mixed with gallium.

3. The method for manufacturing the display device according to claim 1, wherein the hole injection layer is a hole injection electrode.

4. A method for manufacturing a display device comprising the steps of:
    forming a hole injection layer by laminating a first conductive layer containing silicon ranging from 1 atomic % to 6 atomic % and a second conductive layer containing silicon ranging at least from 7 atomic % to 15 atomic %, the hole injection layer being over a first electrode; and
    forming an electroluminescent layer over the hole injection layer.

5. The method for manufacturing the display device according to claim 4, wherein each of the first conductive layer and the second conductive layer contains silicon oxide.

6. The method for manufacturing the display device according to claim 4, wherein each of the first conductive layer and the second conductive layer contains one selected from the group consisting of indium tin oxide, zinc oxide, indium zinc oxide, and zinc oxide mixed with gallium.

7. The method for manufacturing the display device according to claim 4, wherein the hole injection layer is a hole injection electrode.

8. A method for manufacturing a display device comprising the steps of:
    forming a hole injection layer by laminating a plurality of conductive layers using a conductive material containing silicon, the hole injection layer being over a first electrode;
    forming a barrier layer made from left silicon by selectively removing components of the conductive material from a surface of the hole injection layer; and
    forming an electroluminescent layer over the barrier layer.

9. The method for manufacturing the display device according to claim 8, wherein the conductive material contains silicon oxide.

10. The method for manufacturing the display device according to claim 8, wherein the conductive material contains one selected from the group consisting of indium tin oxide, zinc oxide, indium zinc oxide, and zinc oxide mixed with gallium.

11. The method for manufacturing the display device according to claim 8, wherein the hole injection layer is a hole injection electrode.

12. The method for manufacturing the display device according to claim 1, wherein the hole injection layer is formed over a wiring.

13. The method for manufacturing the display device according to claim 4, wherein the hole injection layer is formed over a wiring.

14. The method for manufacturing the display device according to claim 8, wherein the hole injection layer is formed over a wiring.

15. The method for manufacturing the display device according to claim 1, further comprising the step of forming a second electrode over the electroluminescent layer.

* * * * *